(12) United States Patent
Lee

(10) Patent No.: US 12,317,486 B2
(45) Date of Patent: May 27, 2025

(54) SEMICONDUCTOR DEVICE AND MANUFACTURING METHOD OF THE SEMICONDUCTOR DEVICE

(71) Applicant: SK hynix Inc., Icheon-si Gyeonggi-do (KR)

(72) Inventor: Nam Jae Lee, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/501,854

(22) Filed: Nov. 3, 2023

(65) Prior Publication Data

US 2024/0064975 A1   Feb. 22, 2024

Related U.S. Application Data

(62) Division of application No. 17/208,453, filed on Mar. 22, 2021, now Pat. No. 11,832,445.

(30) Foreign Application Priority Data

Sep. 21, 2020   (KR) ......................... 10-2020-0121645

(51) Int. Cl.
*H10B 41/35*   (2023.01)
*H01L 23/522*   (2006.01)
(Continued)

(52) U.S. Cl.
CPC ......... *H10B 41/35* (2023.02); *H01L 23/5226* (2013.01); *H10B 41/27* (2023.02);
(Continued)

(58) Field of Classification Search
CPC ........ H10B 41/35; H10B 41/27; H10B 43/27; H10B 43/35; H10B 63/34; H10B 63/845; H01L 23/5226
See application file for complete search history.

(56) References Cited

U.S. PATENT DOCUMENTS

2009/0179257 A1* 7/2009 Komori ................. H10B 41/27
257/E21.546
2012/0112264 A1* 5/2012 Lee ........................ H10B 43/20
257/E27.026
(Continued)

FOREIGN PATENT DOCUMENTS

KR   1020170115146 A   10/2017
KR   101818675 B1   1/2018

*Primary Examiner* — Fernando L Toledo
*Assistant Examiner* — Jahae Kim
(74) *Attorney, Agent, or Firm* — WILLIAM PARK & ASSOCIATES LTD.

(57) ABSTRACT

A semiconductor device and a manufacturing method of the semiconductor device are provided. The semiconductor device includes a stacked structure including a plurality of conductive patterns and a plurality of insulating patterns alternately stacked on each other, a cell plug passing through the stacked structure, a select plug coupled to the cell plug, and a select pattern surrounding the select plug, wherein the select pattern includes a first conductive portion and a second conductive portion covering a sidewall and a top surface of the first conductive portion, and wherein the conductive patterns, the first conductive portion, and the second conductive portion include different materials.

16 Claims, 32 Drawing Sheets

(51) Int. Cl.
*H10B 41/27* (2023.01)
*H10B 43/27* (2023.01)
*H10B 43/35* (2023.01)
*H10B 63/00* (2023.01)

(52) U.S. Cl.
CPC ............ *H10B 43/27* (2023.02); *H10B 43/35* (2023.02); *H10B 63/34* (2023.02); *H10B 63/845* (2023.02)

(56) References Cited

U.S. PATENT DOCUMENTS

| | | |
|---|---|---|
| 2013/0020647 A1 | 1/2013 | Hwang et al. |
| 2015/0243675 A1 | 8/2015 | Lim et al. |
| 2017/0194326 A1 | 7/2017 | Kim et al. |
| 2017/0287928 A1* | 10/2017 | Kanamori ............ H01L 23/528 |

\* cited by examiner

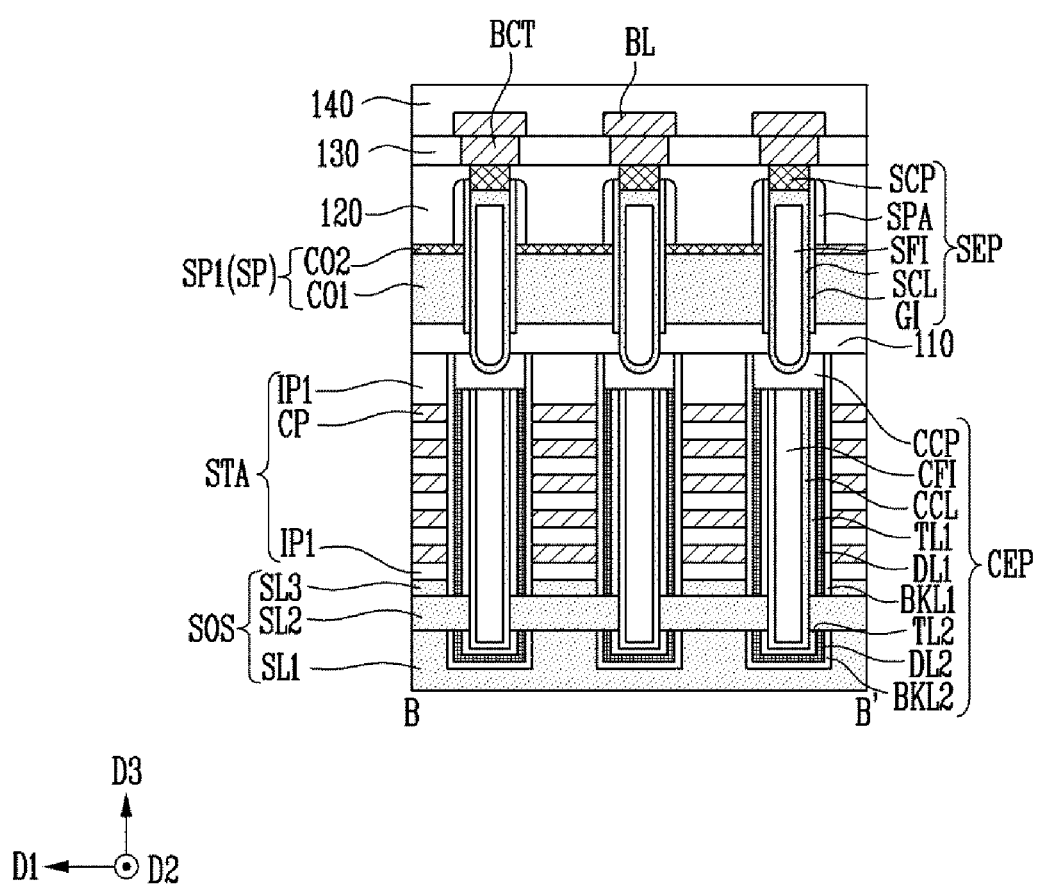

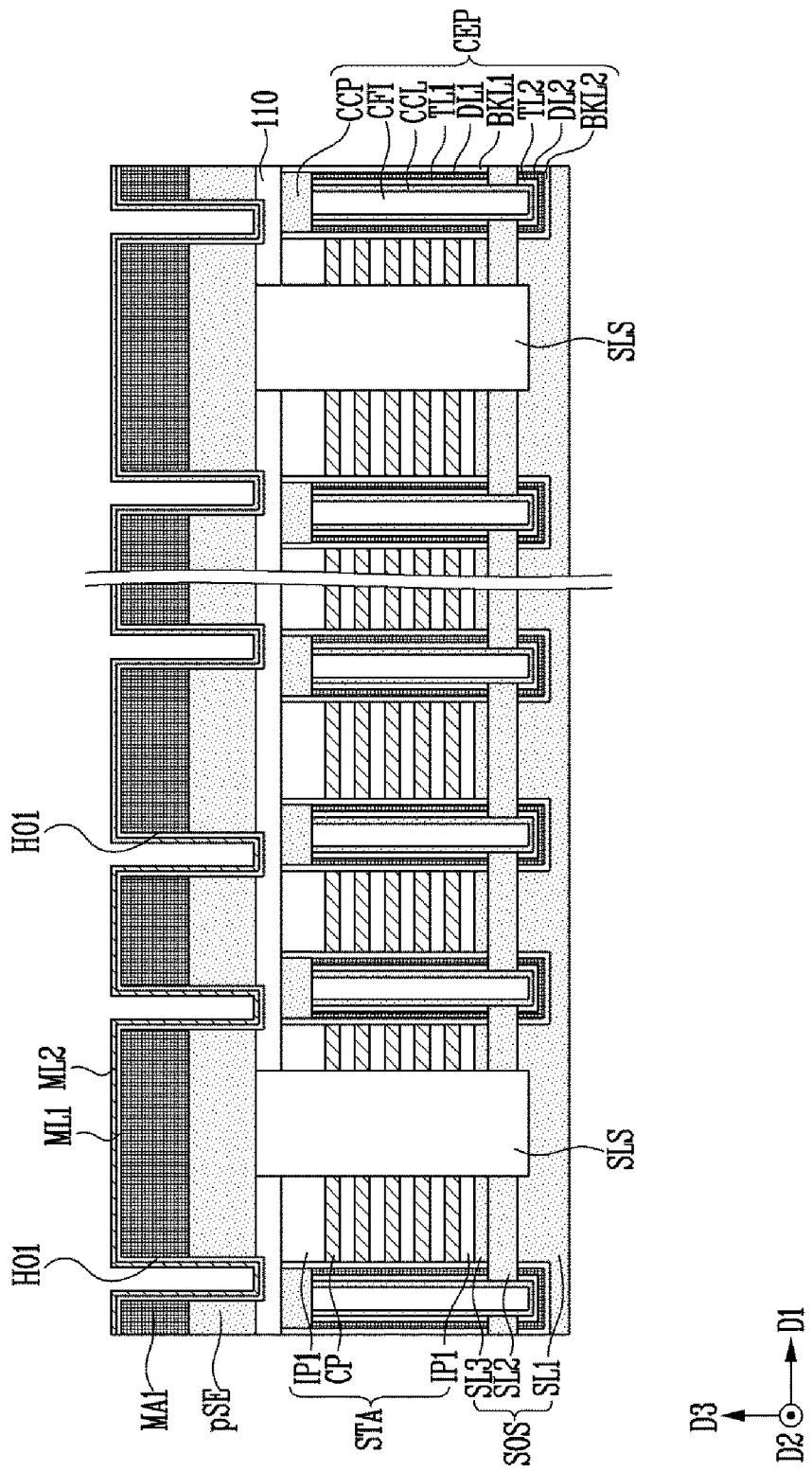

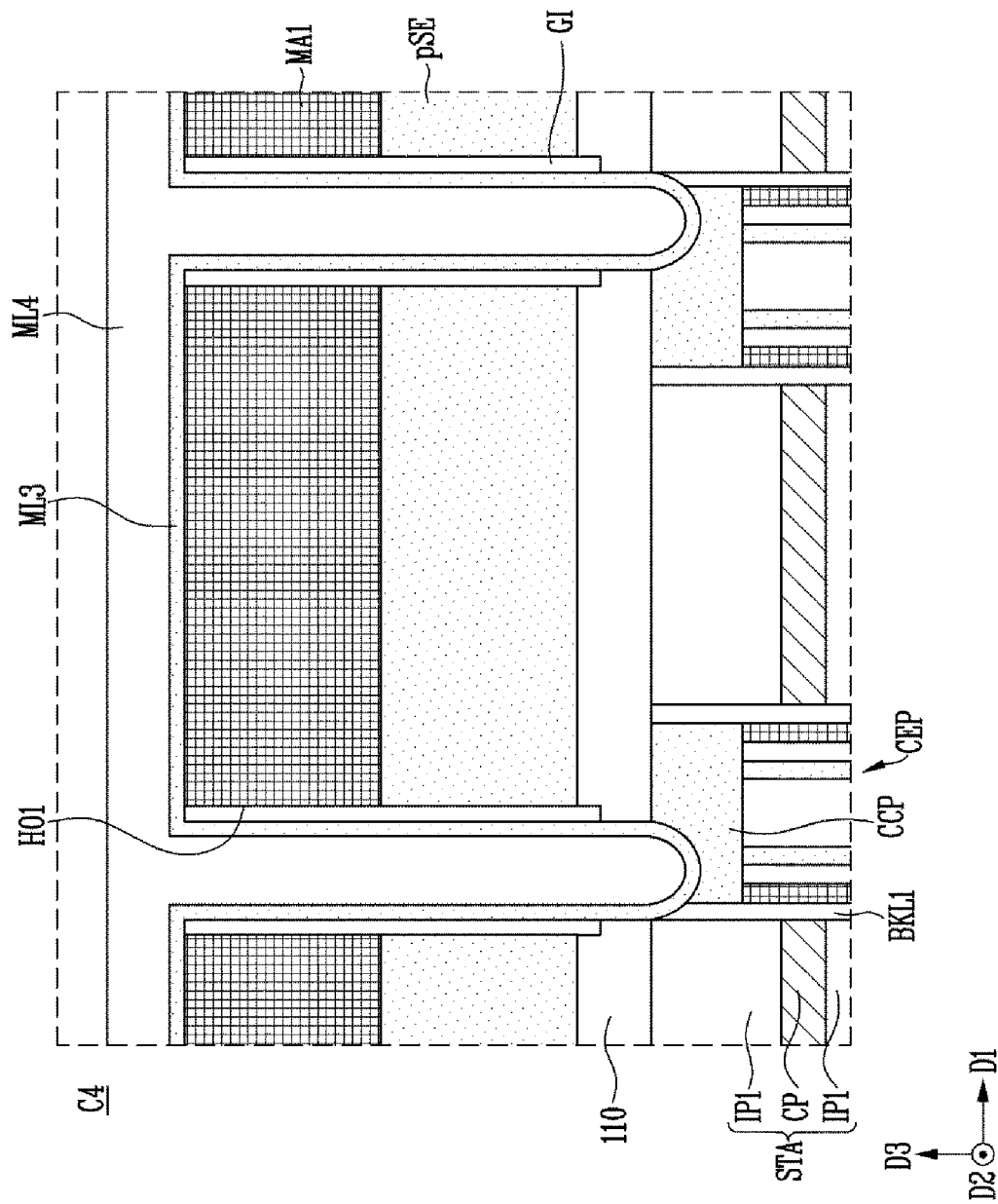

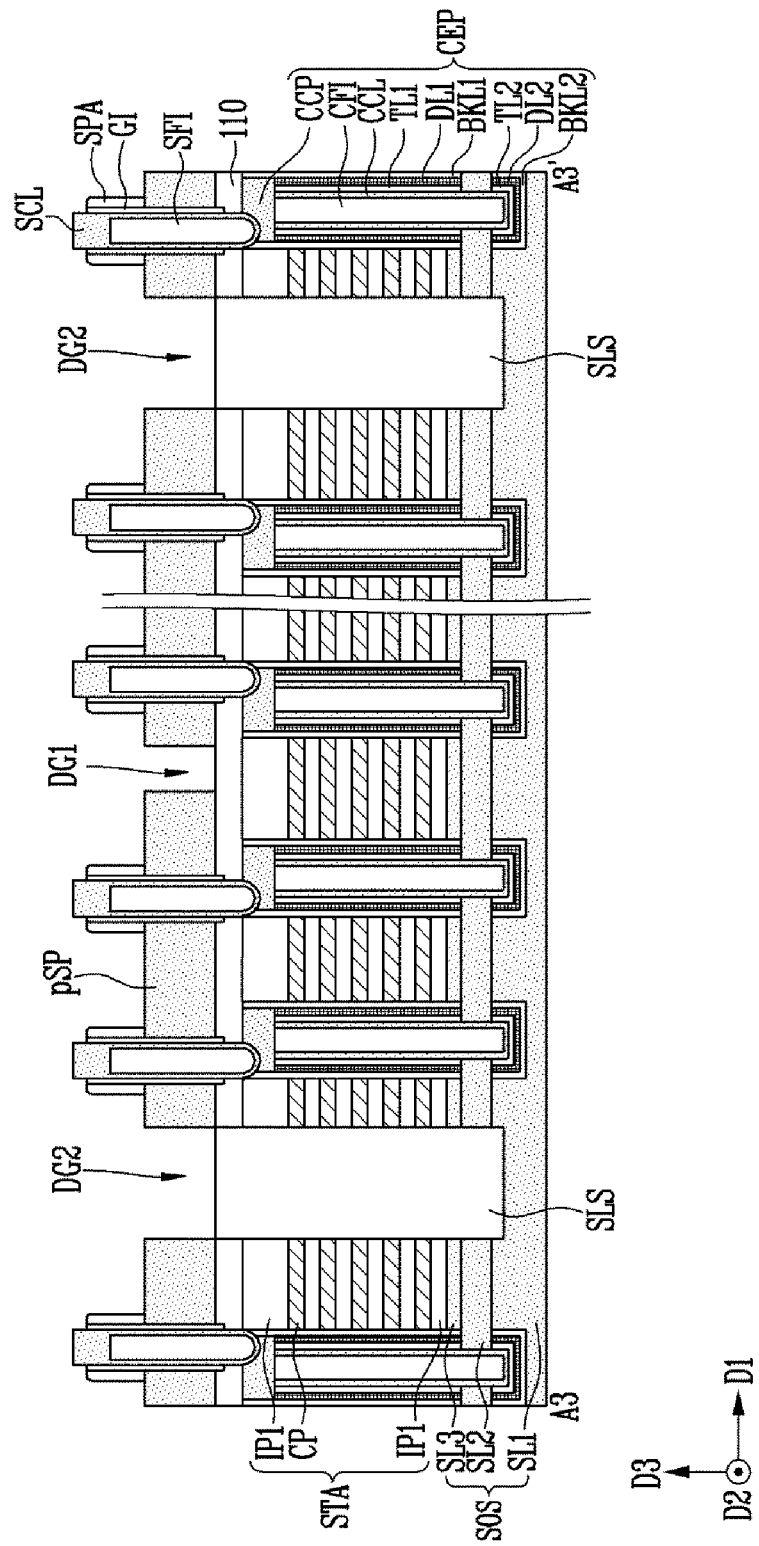

SEMICONDUCTOR DEVICE AND MANUFACTURING METHOD OF THE SEMICONDUCTOR DEVICE

CROSS-REFERENCE TO RELATED APPLICATION

The present application is a divisional application of U.S. patent application Ser. No. 17/208,453, filed on Mar. 22, 2021, and claims priority under 35 U.S.C. § 119(a) to Korean patent application number 10-2020-0121645, filed on Sep. 21, 2020, in the Korean Intellectual Property Office, the entire disclosure of which is incorporated herein by reference.

BACKGROUND

1. Technical Field

Various embodiments of the present disclosure generally relate to a semiconductor device and a method of manufacturing the semiconductor device, and more particularly, to a three-dimensional semiconductor device and a method of manufacturing the three-dimensional semiconductor device.

2. Related Art

A semiconductor memory device may include memory cells capable of storing data. A three-dimensional semiconductor memory device may include three-dimensionally arranged memory cells, such that an area occupied by memory cells per unit area of a substrate may be reduced.

To improve integration density of the three-dimensional semiconductor memory device, the number of memory cells stacked on top of each other may be increased. However, operational reliability of the three-dimensional semiconductor memory device may deteriorate as more memory cells are stacked.

SUMMARY

According to an embodiment, a semiconductor device may include a stacked structure including a plurality of conductive patterns and a plurality of insulating patterns alternately stacked on each other, a cell plug passing through the stacked structure, a select plug coupled to the cell plug, and a select pattern surrounding the select plug, wherein the select pattern includes a first conductive portion and a second conductive portion covering a sidewall and a top surface of the first conductive portion, and wherein the plurality of conductive patterns, the first conductive portion, and the second conductive portion include different materials.

According to an embodiment, a semiconductor device may include a stacked structure that includes a plurality of conductive patterns and a plurality of insulating patterns alternately stacked on each other, a cell plug passing through the stacked structure, a select plug coupled to the cell plug, and a select pattern surrounding the select plug, wherein the select pattern includes a first conductive portion and a second conductive portion covering a sidewall and a top surface of the first conductive portion, wherein the select plug includes a select channel layer coupled to the cell plug and a select capping pattern over the select channel layer, and wherein the second conductive portion and the select capping pattern include a same material.

According to an embodiment, a semiconductor device may include a stacked structure including a plurality of conductive patterns and a plurality of insulating patterns alternately stacked on each other, a cell plug passing through the stacked structure, a select plug coupled to the cell plug, and a select pattern surrounding the select plug, wherein the select pattern includes a first conductive portion and a second conductive portion covering a sidewall and a top surface of the first conductive portion, and wherein the second conductive portion includes metal silicide.

According to an embodiment, a method of manufacturing a semiconductor device may include forming a stacked structure, forming a cell channel layer passing through the stacked structure, forming a select channel layer electrically coupled to the cell channel layer, forming a preliminary select pattern surrounding the select channel layer, forming a diffusion metal layer covering the select channel layer and the preliminary select pattern, and diffusing metal of the diffusion metal layer into the select channel layer and the preliminary select pattern.

According to an embodiment, a method of manufacturing a semiconductor device may include forming a stacked structure, forming a cell channel layer passing through the stacked structure, forming a select channel layer electrically coupled to the cell channel layer, forming a preliminary select pattern surrounding the select channel layer, forming a diffusion metal layer covering the preliminary select pattern, and forming a select pattern by diffusing metal of the diffusion metal layer into the preliminary select pattern, wherein the select pattern includes a first conductive portion and a second conductive portion covering a top surface and a sidewall of the first conductive portion, and wherein the second conductive portion includes the metal of the diffusion metal layer.

BRIEF DESCRIPTION OF THE DRAWINGS

FIG. 1C is a cross-sectional diagram taken along line B-B' of FIG. 1A;

FIGS. 2, 3, 4, 5, 6, 7A, 7B, 8A, 8B, 9A, 9B, 10, 11, 12, 13, 14, 15, 16, 17A, 17B, 18A, 18B, 19, 20A, 20B, 21, and 22 are diagrams illustrating a method of manufacturing a semiconductor device according to embodiments of FIGS. 1A, 1B, 1C, and 1D;

DETAILED DESCRIPTION

Specific structural or functional descriptions disclosed herein are merely illustrative for the purpose of describing embodiments according to the concept of the present disclosure. Embodiments according to the concept of the present disclosure may be implemented in various forms, and should not be construed as being limited to the specific embodiments set forth herein.

Hereinafter, the terms 'first' and 'second' are used to distinguish one component from another component. As such, the components should not be limited by these terms.

Various embodiments are directed to a semiconductor device capable of minimizing an RC delay of a select transistor.

Figure 1A:
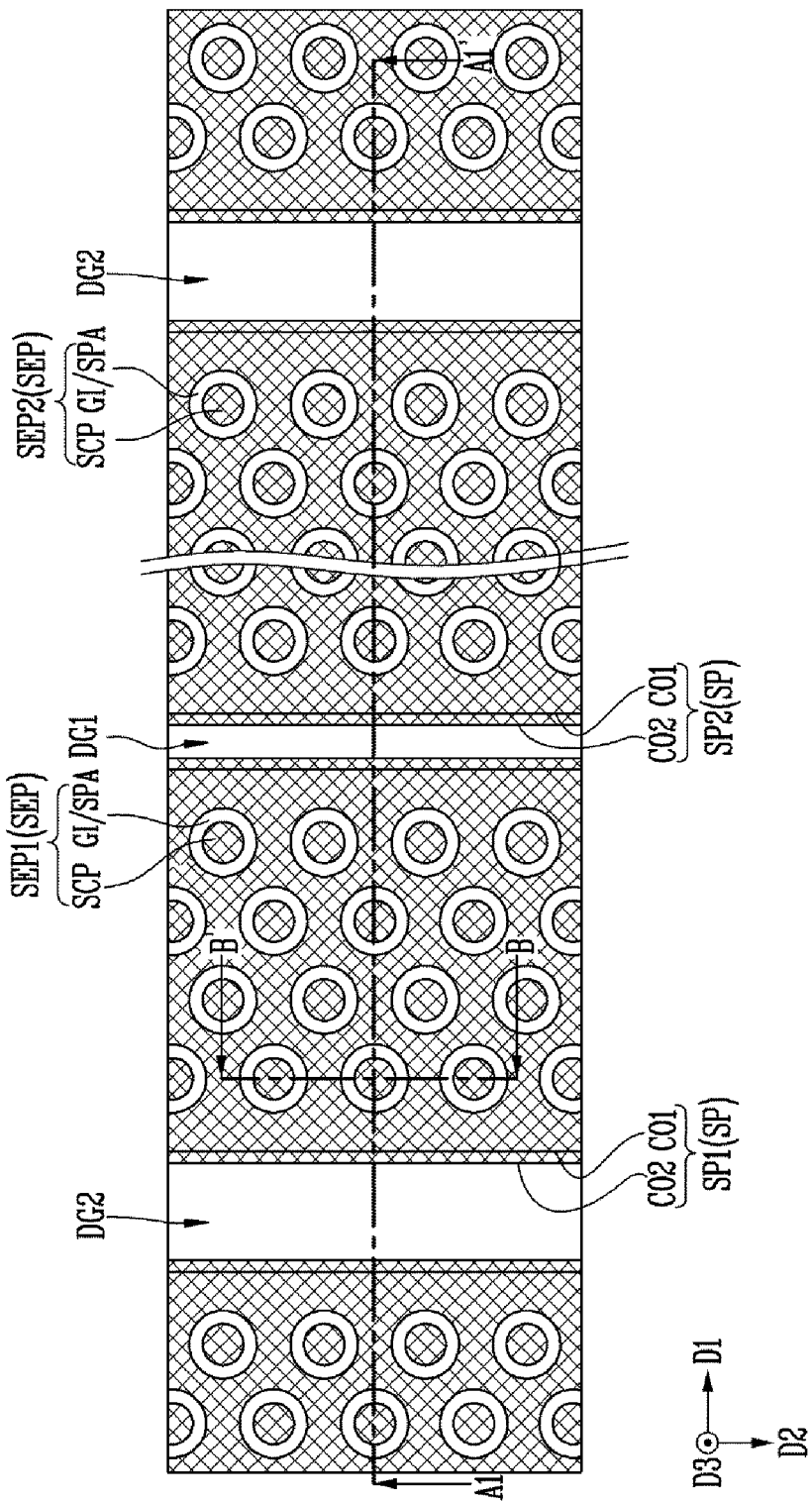
FIG. 1A is a plan view of a semiconductor device according to an embodiment.
Figure 1B:
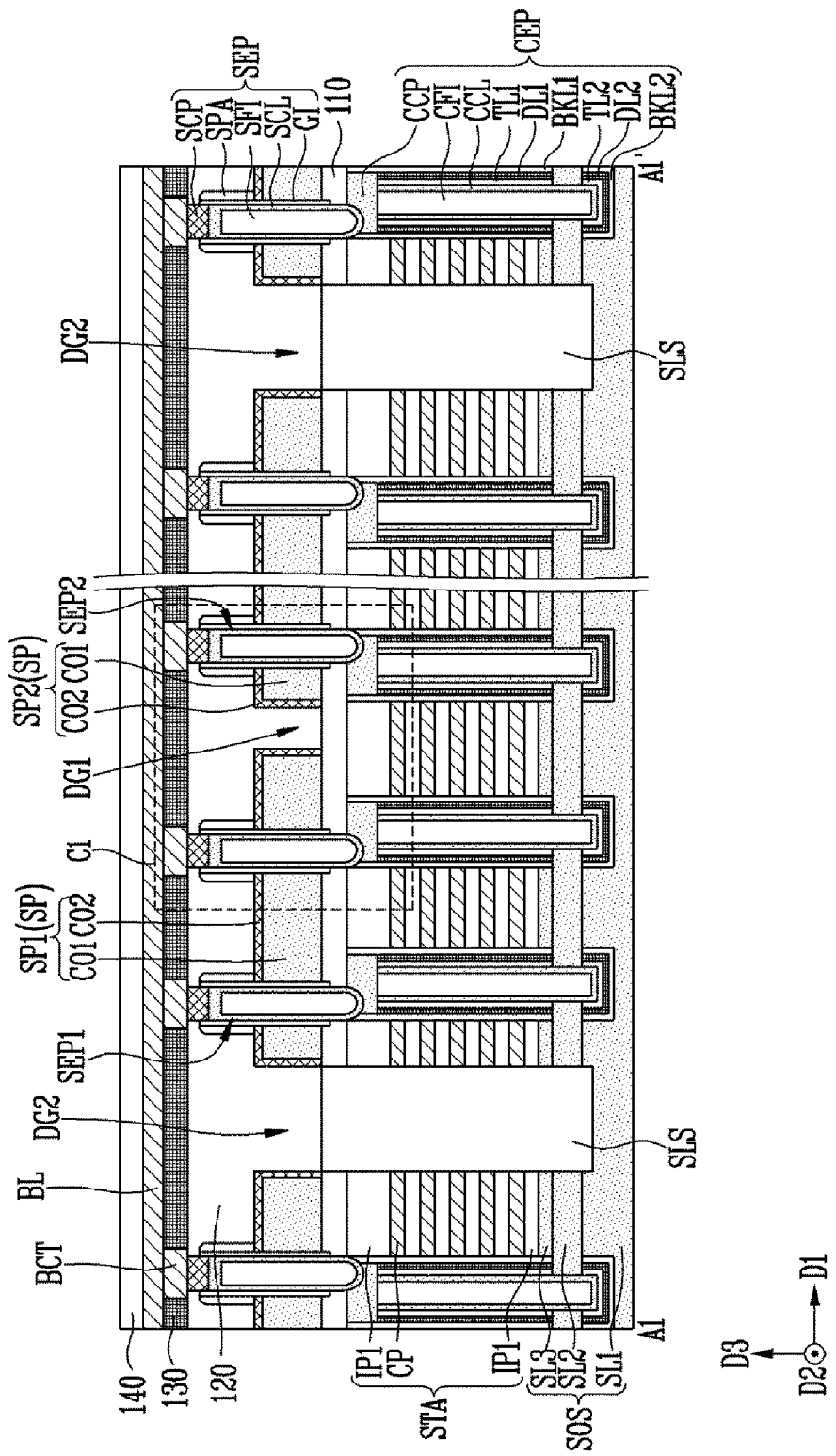
FIG. 1B is a cross-sectional diagram taken along line A1-A1' of FIG. 1A.
Figure 1D:
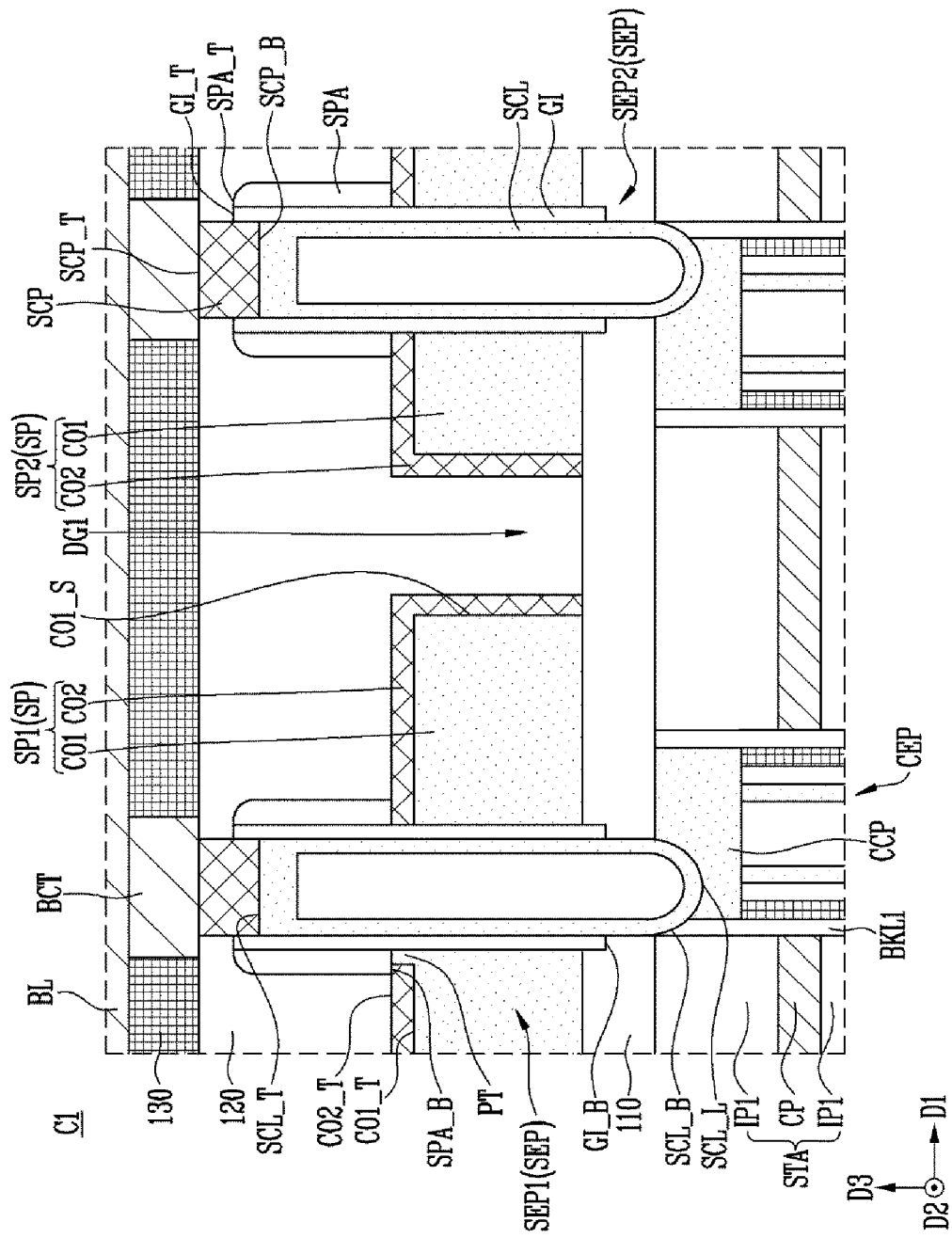
FIG. 1D is an enlarged view of region C1 of FIG. 1B.

FIG. 1A is a plan view of a semiconductor device according to an embodiment. FIG. 1B is a cross-sectional diagram taken along line A1-A1' of FIG. 1A. FIG. 1C is a cross-sectional diagram taken along line B-B' of FIG. 1A. FIG. 1D is an enlarged view of region C1 of FIG. 1B.

Referring to FIGS. 1A, 1B, 1C and 1D, the semiconductor device may include a source structure SOS. The source structure SOS may have a plate shape expanding along a plane defined by a first direction D1 and a second direction D2. The first direction D1 and the second direction D2 may cross each other. For example, the first direction D1 and the second direction D2 may cross at right angles. The source structure SOS may serve as a source line of the semiconductor device. The source structure SOS may include a conductive material such as polysilicon.

According to an embodiment, the source structure SOS may be provided on a substrate (not shown) physically supporting the source structure SOS. The substrate, which may be a semiconductor substrate, may have a plate shape expanding along a plane defined by the first direction D1 and the second direction D2.

According to an embodiment, a peripheral circuit structure (not shown) including transistors and lines may be provided between the source structure SOS and the substrate.

The source structure SOS may include a first source layer SL1, a second source layer SL2 and a third source layer SL3. The second source layer SL2 may be provided over the first source layer SL1, and the third source layer SL3 may be provided over the second source layer SL2. The first, second, and third source layers SL1, SL2, and SL3 may include a conductive material such as polysilicon.

A stacked structure STA may be provided over the source structure SOS. The stacked structure STA may include conductive patterns CP and first insulating patterns IP1 alternately stacked on each other in a third direction D3. The third direction D3 may cross the first direction D1 and the second direction D2. For example, the third direction D3 may cross the first direction D1 and the second direction D2 at right angles.

The first insulating patterns IP1 may include an insulating material such as an oxide. Each of the conductive patterns CP may include a conductive layer such as, for example, at least one of a doped silicon layer, a metal silicide layer, tungsten, nickel, and cobalt. According to an embodiment, each of the conductive patterns CP may further include a barrier layer covering a surface of the conductive layer, wherein the barrier layer may be formed between the conductive layer and the first insulating pattern IP1. For example, the barrier layer may include titanium, titanium nitride, tantalum, or tantalum nitride. The conductive patterns CP may serve as word lines of the semiconductor device.

Cell plugs CEP passing through the stacked structure STA may be provided. Each of the cell plugs CEP may include a cell filling layer CFI, a cell channel layer CCL surrounding the cell filling layer CFI, a first tunnel insulating layer TL1 surrounding upper and middle portions of the cell channel layer CCL, a second tunnel insulating layer TL2 surrounding a lower portion of the cell channel layer CCL, a first data storage layer DL1 surrounding the first tunnel insulating layer TL1, a second data storage layer DL2 surrounding the second tunnel insulating layer TL2, a first blocking layer BKL1 surrounding the first data storage layer DL1, and a second blocking layer BKL2 surrounding the second data storage layer DL2. The cell plug CEP may extend in the third direction D3.

The cell filling layer CFI may extend in the third direction D3. The cell filling layer CFI may include an insulating material such as an oxide.

The cell channel layer CCL may extend in the third direction D3. The cell channel layer CCL may contact the second source layer SL2 of the source structure SOS. The cell channel layer CCL may be coupled to the second source layer SL2 of the source structure SOS and may be electrically coupled to the second source layer SL2 of the source structure SOS. The cell channel layer CCL may include a conductive material such as polysilicon.

The first and second tunnel insulating layers TL1 and TL2 may be spaced apart from each other in the third direction D3. The second source layer SL2 may be disposed between the first and second tunnel insulating layers TL1 and TL2. The first and second tunnel insulating layers TL1 and TL2 may include a material, such as an oxide, that allows charge tunneling.

The first and second data storage layers DL1 and DL2 may be spaced apart from each other in the third direction D3. The second source layer SL2 may be disposed between the first and second data storage layers DL1 and DL2. According to an embodiment, the first and second data storage layers DL1 and DL2 may include a material, such as a nitride, in which charges are trapped. According to another embodiment, the first and second data storage layers DL1 and DL2 may include various materials depending on a method of storing data. For example, the first and second data storage layers DL1 and DL2 may include silicon, a phase-change material or nanodots.

The first and second blocking layers BKL1 and BKL2 may be spaced apart from each other in the third direction D3. The second source layer SL2 may be disposed between the first and second blocking layers BKL1 and BKL2. The first and second blocking layers BKL1 and BKL2 may include a material, such as an oxide, which is capable of blocking movement of charges.

The cell plug CEP may further include a cell capping pattern CCP. The cell capping pattern CCP may cover top surfaces of the cell filling layer CFI, the cell channel layer CCL, the first tunnel insulating layer TL1, and the first data storage layer DL1. A bottom surface of the cell capping pattern CCP may contact the top surface of the cell channel layer CCL. The cell capping pattern CCP may be electrically coupled to the cell channel layer CCL. The first blocking layer BKL1 may surround the cell capping pattern CCP. An inner sidewall of the first blocking layer BKL1 may contact an outer sidewall of the cell capping pattern CCP. The cell capping pattern CCP may include a conductive material such as polysilicon.

A first insulating layer 110 may be provided over the stacked structure STA. The first insulating layer 110 may cover top surfaces of the cell plugs CEP. The first insulating layer 110 may include an insulating material such as an oxide.

Slit structures SLS may be provided. The slit structures SLS may pass through the first insulating layer 110 and the stacked structure STA. Each of the slit structures SLS may extend in the second direction D2 and the third direction D3. The conductive patterns CP disposed at both sides of each of the slit structures SLS may be separated from each other in the first direction D1 by the slit structures SLS. The insulating patterns IP1 disposed at both sides of each of the slit structures SLS may be separated from each other in the first direction D1 by the slit structures SLS. The slit structure SLS may be disposed between the cell plugs CEP. The cell plugs CEP may be disposed at both sides of each of the slit structures SLS. The slit structure SLS may include an insulating material such as an oxide. Although not illustrated in FIG. 1B, in an embodiment, the slit structure SLS may further include a source contact electrically coupled to the source structure SOS.

A second insulating layer 120 may be provided over the first insulating layer 110. The second insulating layer 120 may cover top surfaces of the slit structures SLS. The second insulating layer 120 may include an insulating material such as an oxide.

Select plugs SEP passing through the second insulating layer 120 may be provided. Each of the select plugs SEP may include a select filling layer SFI, a select channel layer SCL, a gate insulating layer GI, a spacer SPA and a select capping pattern SCP. The select plug SEP may extend in the third direction D3. The select plug SEP may contact the cell plug CEP. The select plug SEP may be coupled to the cell plug CEP and may be electrically coupled to the cell plug CEP.

Select patterns SP surrounding the select plugs SEP may be provided. Each of the select patterns SP may surround a plurality of select plugs SEP. The select patterns SP may be provided over a top surface of the first insulating layer 110. The select patterns SP may be provided in the second insulating layer 120 and may serve as select lines of the semiconductor device.

Each of the select patterns SP may include a first conductive portion CO1 and a second conductive portion CO2 surrounding the first conductive portion CO1 wherein the first conductive portion CO1 and the second conductive portion CO2 may include different materials. For example, the first conductive portion CO1 may include polysilicon and the second conductive portion CO2 may include metal silicide. For example, the metal silicide included in the second conductive portion CO2 may be nickel silicide. For example, a composition of the nickel silicide included in the second conductive portion CO2 may be NiSi. The first conductive portion CO1 of the select pattern SP, the second conductive portion CO2 of the select pattern SP, and the conductive pattern CP of the stacked structure STA may include different materials.

A plurality of select patterns SP may be disposed between the adjacent slit structures SLS, wherein the plurality of select patterns SP may be disposed between the slit structures SLS adjacent to each other in the first direction D1. The select patterns SP disposed between the adjacent slit structures SLS may be spaced apart from each other such that, for example, the select patterns SP disposed between the slit structures SLS adjacent to each other in the first direction D1 may be spaced apart from each other in the first direction D1. A space between the adjacent select patterns SP disposed between the adjacent slit structures SLS may be defined as a first isolation gap DG1. The first isolation gap DG1 may be filled with the second insulating layer 120. The select patterns SP disposed between the adjacent slit structures SLS may be spaced apart from each other by the first isolation gap DG1.

The select patterns SP disposed at both sides of the slit structure SLS may be spaced apart from each other. For example, the select patterns SP disposed at both sides of the slit structure SLS may be spaced apart from each other in the first direction D1. A space between the select patterns SP disposed at both sides of the slit structure SLS may be defined as a second isolation gap DG2. The second isolation gap DG2 may be filled with the second insulating layer 120. The select patterns disposed at both sides of the slit structure SLS may be spaced apart from each other by the second isolation gap DG2.

A third insulating layer 130 may be provided over the second insulating layer 120 and may include an insulating material. For example, the third insulating layer 130 may include a nitride.

Bit line contacts BCT may be provided in the third insulating layer 130. The bit line contact BCT may contact the select plug SEP and may be coupled to the select plug SEP. The bit line contact BCT may be electrically coupled to the select plug SEP. The bit line contact BCT may include a conductive material.

A fourth insulating layer 140 may be provided over the third insulating layer 130. The fourth insulating layer 140 may include an insulating material such as an oxide.

Bit lines BL may be provided in the fourth insulating layer 140. The bit line BL may contact the bit line contacts BCT. The bit line BL may be coupled to the bit line contacts BCT. The bit line BL may be electrically coupled to the bit line contacts BCT and may include a conductive material.

Referring to FIG. 1D, the select filling layer SFI of the select plug SEP may extend in the third direction D3 to pass through the select pattern SP and the first insulating layer 110. The select filling layer SFI may include an insulating material such as an oxide.

The select channel layer SCL of the select plug SEP may extend in the third direction D3 to pass through the select pattern SP and the first insulating layer 110. The select channel layer SCL may surround the select filling layer SFI. A bottom surface SCL_B of the select channel layer SCL may be curved. The bottom surface SCL_B of the select channel layer SCL may contact top surfaces of the cell capping pattern CCP and the first blocking layer BKL1. The top surface of the cell capping pattern CCP and the top surface of the first blocking layer BKL1 may correspond to the bottom surface SCL_B of the select channel layer SCL and may be curved. A lowermost portion SCL_L of the select channel layer SCL may be disposed in the cell capping pattern CCP. The select channel layer SCL may cover a top surface of the select filling layer SFI and may include a conductive material. The select channel layer SCL may include the same material as the first conductive portion CO1 of the select pattern SP and the cell channel layer CCL of the cell plug CEP. The select channel layer SCL may include a different material from the second conductive portion CO2 of the select pattern SP and the select capping pattern SCP. For example, the select channel layer SCL may include polysilicon.

The select capping pattern SCP of the select plug SEP may be disposed over the select channel layer SCL. The select capping pattern SCP may contact the select channel layer SCL and the bit line contact BCT. The select capping pattern SCP may be coupled to the select channel layer SCL and the bit line contact BCT. The select capping pattern SCP may be electrically coupled to the select channel layer SCL and the bit line contact BCT. A bottom surface SCP_B of the select capping pattern SCP may cover a top surface SCL_T of the select channel layer SCL. A bottom surface of the bit line contact BCT may contact a top surface SCP_T of the select capping pattern SCP. The select capping pattern SCP may include the same material as the second conductive portion CO2 of the select pattern SP. The select capping pattern SCP may include a metal silicide such as nickel silicide. For example, a composition of the nickel silicide included in the select capping pattern SCP may be NiSi.

The gate insulating layer GI of the select plug SEP may extend in the third direction D3 to pass through the select pattern SP. The gate insulating layer GI may surround the select channel layer SCL and the select capping pattern SCP. The gate insulating layer GI may surround a lower portion of the select capping pattern SCP.

A level of a bottom surface GI_B of the gate insulating layer GI may be higher than a level of the bottom surface SCL_B of the select channel layer SCL. The bottom surface GI_B of the gate insulating layer GI may be disposed in the first insulating layer 110. The level of the bottom surface GI_B of the gate insulating layer GI may be lower than a level of the top surface of the first insulating layer 110 and may be higher than a level of a bottom surface of the first insulating layer 110. A level of a top surface GI_T of the gate insulating layer GI may be higher than a level of the top surface SCL_T of the select channel layer SCL. The level of the top surface GI_T of the gate insulating layer GI may be higher than a level of the bottom surface SCP_B of the select capping pattern SCP. The level of the top surface GI_T of the gate insulating layer GI may be lower than a level of the top surface SCP_T of the select capping pattern SCP. The gate insulating layer GI may include an insulating material such as an oxide.

The spacer SPA of the select plug SEP may extend in the third direction D3. The spacer SPA may surround the gate insulating layer GI. The spacer SPA may surround an upper portion of the gate insulating layer GI. A thickness of the spacer SPA may be greater than a thickness of the gate insulating layer GI. A level of a top surface SPA_T of the spacer SPA may be the same as the level of the top surface GI_T of the gate insulating layer GI. The level of the top surface SPA_T of the spacer SPA may be higher than the level of the bottom surface SCP_B of the select capping pattern SCP and may be higher than the level of the top surface SCL_T of the select channel layer SCL. The level of the top surface SPA_T of the spacer SPA may be lower than the level of the top surface SCP_T of the select capping pattern SCP. The spacer SPA may be provided over the select pattern SP. The bottom surface SPA_B of the spacer SPA may contact a top surface CO2_T of the second conductive portion CO2 of the select pattern SP. The spacer SPA may include an insulating material such as an oxide.

The second conductive portion CO2 of the select pattern SP may cover a top surface CO1_T and a sidewall CO1_S of the first conductive portion CO1. The first conductive portion CO1 may be spaced apart from the second insulating layer 120 by the second conductive portion CO2. The top surface CO1_T and the sidewall CO1_S of the first conductive portion CO1 may be spaced apart from the second insulating layer 120. A bottom surface of the first conductive portion CO1 may contact the top surface of the first insulating layer 110.

The first conductive portion CO1 may include a protrusion PT passing through the second conductive portion CO2. The protrusion PT may protrude from the top surface CO1_T of the first conductive portion CO1 in the third direction D3. A sidewall of the protrusion PT may contact a sidewall of the gate insulating layer GI or the second conductive portion CO2. A top surface of the protrusion PT may contact the bottom surface SPA_B of the spacer SPA.

The select plugs SEP may include a first select plug SEP1 and a second select plug SEP2. The first select plug SEP1 may have a center which is offset from a center of the cell plug CEP in a direction opposite to the first direction D1.

The second select plug SEP2 may have a center which is offset from the center of the cell plug CEP in the first direction D1.

The select pattern SP may include a first select pattern SP1 and a second select pattern SP2. The first select pattern SP1 may surround a plurality of first select plugs SEP1. The second select pattern SP2 may surround a plurality of second select plugs SEP2. The first and second select patterns SP1 and SP2 may be disposed between the adjacent slit structures SLS. The first and second select patterns SP1 and SP2 disposed between the adjacent slit structures SLS may be spaced apart from each other by the first isolation gap DG1.

A semiconductor device according to an embodiment includes the select patterns SP and the select plugs SEP that may be formed through processes separate from processes of forming the conductive patterns CP and the cell plugs CEP. Accordingly, a space between the select patterns SP may be reduced and a dummy cell plug disposed in the space between the select patterns SP may be omitted. Thus, an area of a cell region may be reduced.

The semiconductor device according to an embodiment includes the select capping pattern SCP coupling the select channel layer SCL and the bit line contact BCT. Accordingly, a separate contact for coupling the select channel layer SCL and the bit line contact BCT may be omitted.

In the semiconductor device according to an embodiment, the second conductive portion CO2 covering the top surface CO1_T and the sidewall CO1_S of the first conductive portion CO1 of the select pattern SP may include nickel silicide. Accordingly, an RC delay of a select transistor may be minimized and resistance of a select line may be reduced.

According to an embodiment, the degree of freedom for a length of the select channel layer SCL may be increased. Thus, the select channel layer SCL may have a length sufficient to reduce the off current of the select transistor.

FIGS. 2, 3, 4, 5, 6, 7A, 7B, 8A, 8B, 9A, 9B, 10, 11, 12, 13, 14, 15, 16, 17A, 17B, 18A, 18B, 19, 20A, 20B, 21, and 22 are diagrams illustrating a method of manufacturing the semiconductor device according to embodiments of FIGS. 1A, 1B, 1C, and 1D.

Figure 2:
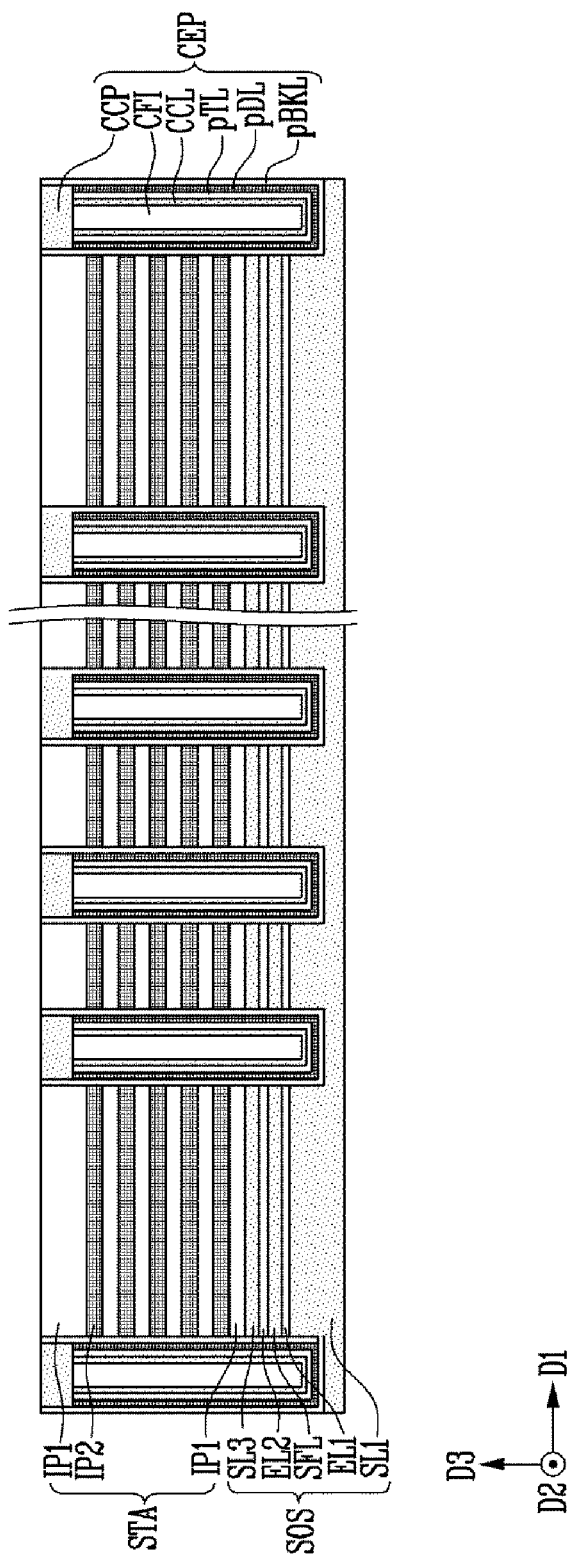

Referring to FIG. 2, the source structure SOS, the stacked structure STA, and the cell plugs CEP may be formed as illustrated. Forming the source structure SOS may include sequentially forming the first source layer SL1, a first etch stop layer EL1, a source sacrificial layer SFL, a second etch stop layer EL2, and the third source layer SL3 in the third direction D3. The first and second etch stop layers EL1 and EL2 may include different materials from the first and third source layers SL1 and SL3. For example, the first and second etch stop layers EL1 and EL2 may include an oxide. The source sacrificial layer SFL may include the same material as the first and third source layers SL1 and SL3, such as, for example, polysilicon.

The stacked structure STA may be formed over the source structure SOS. Forming the stacked structure STA may include alternately stacking first insulating layers and second insulating layers over the source structure SOS in the third direction D3. The first and second insulating layers may include different materials from each other. For example, the first insulating layer may include an oxide and the second insulating layer may include a nitride.

The cell plugs CEP passing through the stacked structure STA may be formed. Forming each of the cell plugs CEP may include forming a hole that passes through the stacked structure STA and sequentially forming a preliminary blocking layer pBKL, a preliminary data storage layer pDL, a preliminary tunnel insulating layer pTL, the cell channel layer CCL, the cell filling layer CFI, and the cell capping pattern CCP in the hole. The preliminary blocking layer pBKL may include a material capable of blocking movement of charges. According to an embodiment, the preliminary data storage layer pDL may include a material in which charges are trapped. The preliminary tunnel insulating layer pTL may include a material allowing charge tunneling.

As the cell plugs CEP are formed, the first insulating layer of the stacked structure STA may be patterned into, and defined as, a first insulating pattern IP1 and the second insulating layer of the stacked structure STA may be patterned into, and defined as, a second insulating pattern IP2. The second insulating pattern IP2 may include a different material from the first insulating pattern IP1 such as a nitride.

Figure 3:
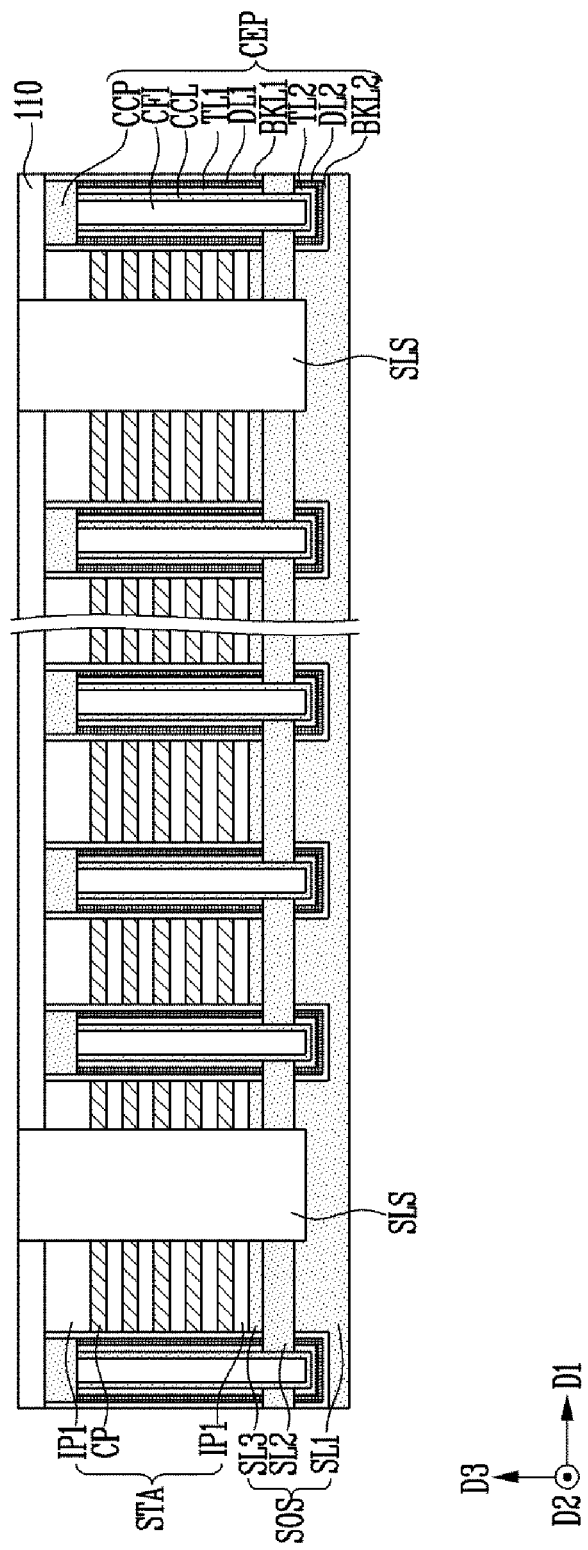

Referring to FIG. 3, the first insulating layer 110 may be formed over the stacked structure STA. Subsequently, the second source layer SL2 of the source structure SOS, the conductive patterns CP of the stacked structure STA, and the slit structures SLS may be formed.

Forming the second source layer SL2, the conductive patterns CP, and the slit structures SLS may include forming slits that pass through the stacked structure STA, removing the source sacrificial layer SFL, the first etch stop layer EL1, and the second etch stop layer EL2 from the source structure SOS through the slits, exposing a sidewall of the cell channel layer CCL by patterning the preliminary blocking layer pBKL, the preliminary data storage layer pDL, and the preliminary tunnel insulating layer pTL, forming the second source layer SL2 that is coupled to the sidewall of the cell channel layer CCL, removing the second insulating patterns IP2 from the stacked structure STA through the slits, forming the conductive patterns CP in spaces of the stacked structure STA from which the second insulating patterns IP2 are removed, and forming the slit structures SLS in the slits.

Figure 4:
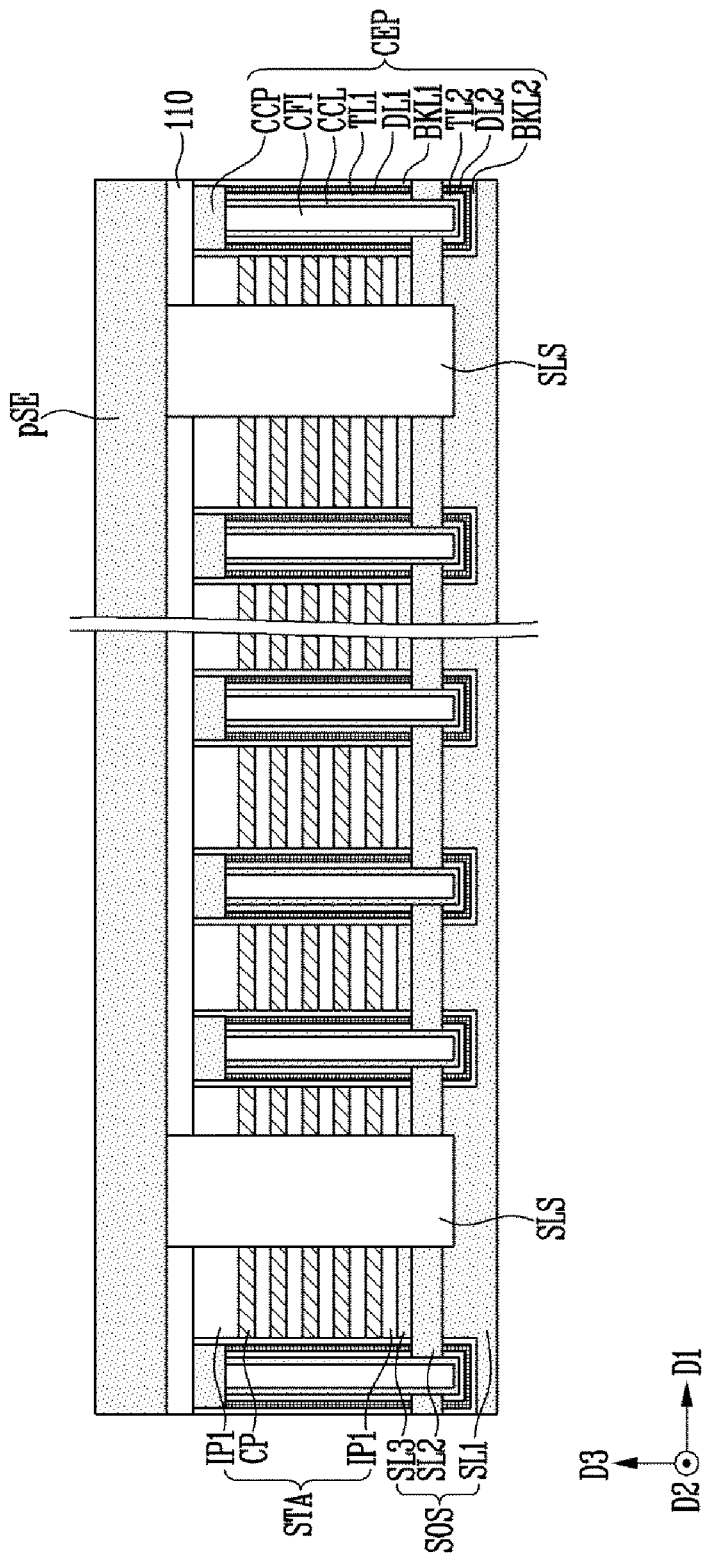

Referring to FIG. 4, a preliminary select layer pSE may be formed over the first insulating layer 110. The preliminary select layer pSE may cover the top surfaces of the slit structures SLS and may include a conductive material. For example, the preliminary select layer pSE may include polysilicon.

Figure 5:
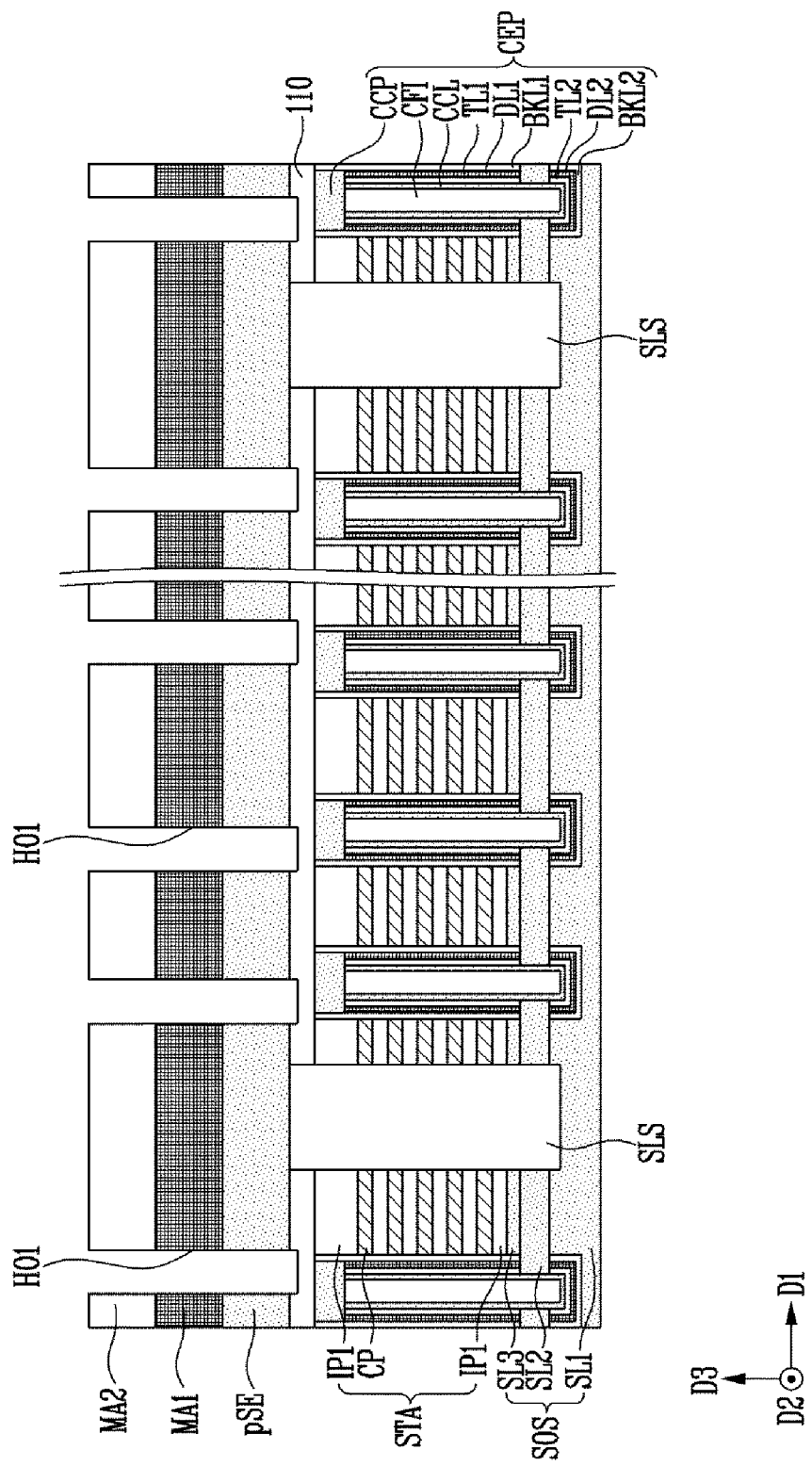

Referring to FIG. 5, a first mask layer MA1 may be formed over the preliminary select layer pSE, and a second mask layer MA2 may be formed over the first mask layer MA1. The preliminary select layer pSE, the first mask layer MA1, and the second mask layer MA2 may include different materials from each other. For example, the first mask layer MA1 may include a nitride and the second mask layer MA2 may include a photoresist layer.

Subsequently, first holes HO1 passing through the preliminary select layer pSE, the first mask layer MA1, and the second mask layer MA2 may be formed. Parts of the first insulating layer 110 may be exposed by the first holes HO1. The second mask layer MA2 may be removed after the first holes HO1 are formed.

Referring to FIG. 6, a first material layer ML1 covering the first insulating layer 110, the preliminary select layer pSE, and the first mask layer MA1 may be formed. The first material layer ML1 may be conformally formed on the first insulating layer 110, the preliminary select layer pSE, and the first mask layer MA1. The first material layer ML1 may include an insulating material such as an oxide.

A second material layer ML2 covering the first material layer ML1 may be formed. The second material layer ML2 may be conformally formed on the first material layer ML1. The second material layer ML2 may include a conductive material such as polysilicon.

Each of the first holes HO1 may be partially filled with the first and second material layers ML1 and ML2.

Figure 7A:
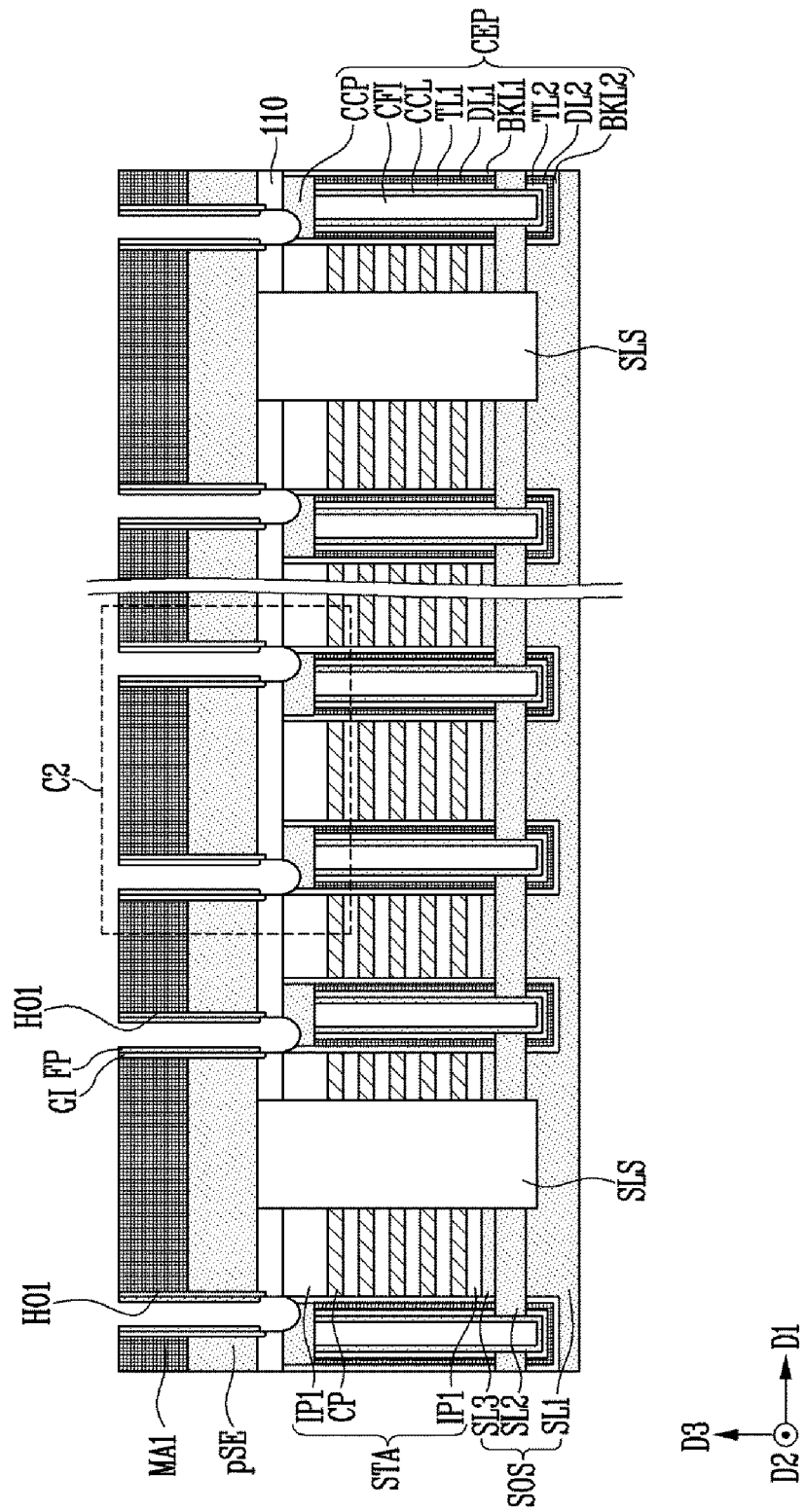
Figure 7B:
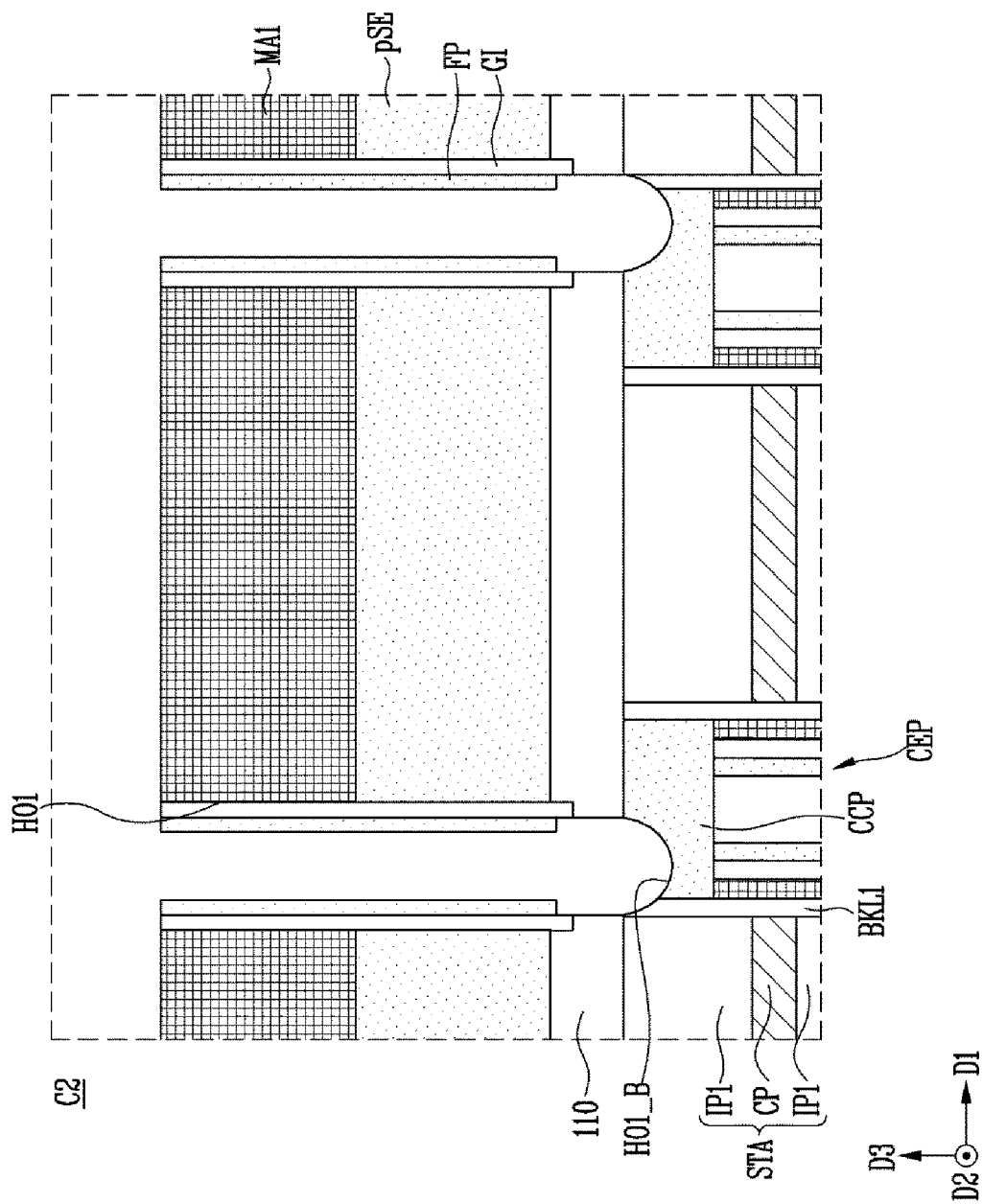

FIG. 7B is an enlarged view of region C2 of FIG. 7A.

Referring to FIGS. 7A and 7B, the first holes HO1 may be expanded. Expanding each of the first holes HO1 may include sequentially etching the second material layer ML2, the first material layer ML1, and the first insulating layer 110. Expanding each of the first holes HO1 may include sequentially removing a part of the second material layer ML2, a part of the first material layer ML1, and a part of the first insulating layer 110 through the first hole HO1. The part of the second material layer ML2, the part of the first material layer ML1, and the part of the first insulating layer 110 that are removed may be parts disposed between the first hole HO1 and the cell plug CEP. The part of the second material layer ML2, the part of the first material layer ML1, and the part of the first insulating layer 110 may be removed to expose the cell capping pattern CCP and the first blocking layer BKL1 of the cell plug CEP. Expanding each of the first holes HO1 may further include removing a part of the cell capping pattern CCP and a part of the first blocking layer BKL1.

A sacrificial pattern FP remaining in the first hole HO1 may be formed by etching the second material layer ML2. The gate insulating layer GI remaining in the first hole HO1 may be formed by etching the first material layer ML1.

A bottom surface HO1_B of the expanded first hole HO1 may be curved. The top surface of the cell capping pattern CCP and the top surface of the first blocking layer BKL1 may correspond to the bottom surface HO1_B of the expanded first hole HO1 and may be curved.

Figure 8A:
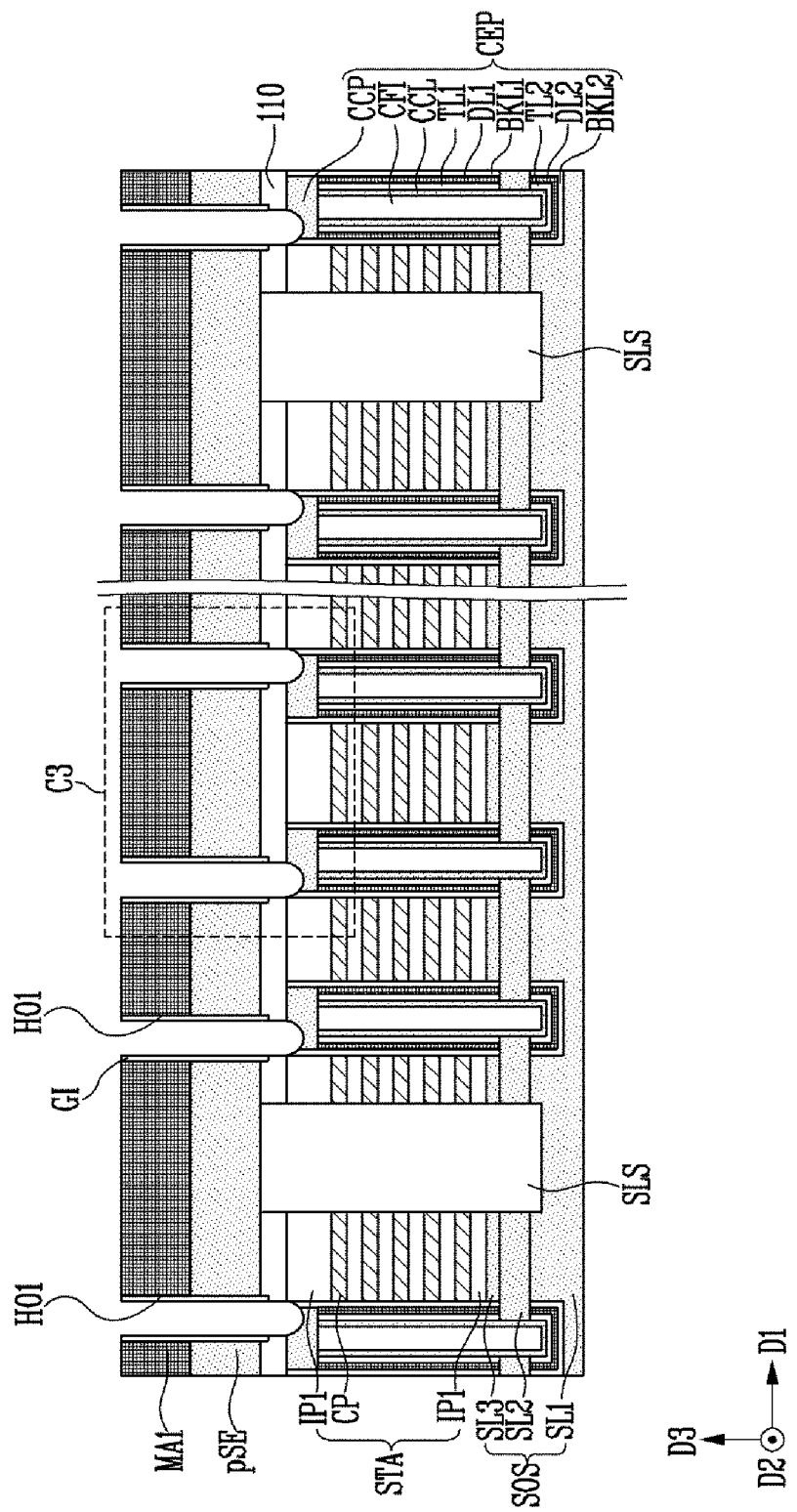
Figure 8B:
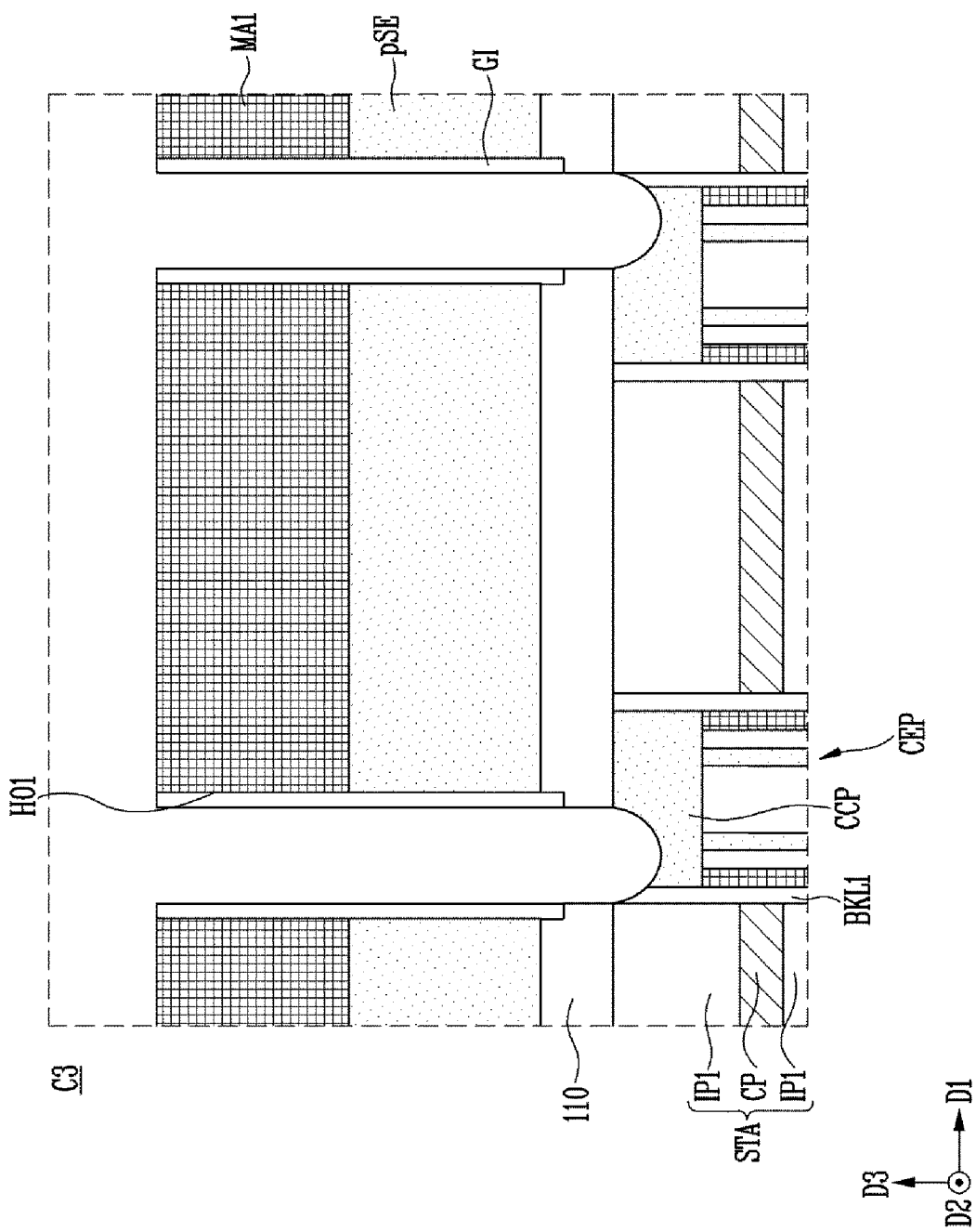

FIG. 8B is an enlarged view of region C3 of FIG. 8A.

Referring to FIGS. 8A and 8B, the sacrificial patterns FP may be removed from the first holes HO1. When the sacrificial patterns FP are removed, inner sidewalls of the gate insulating layers GI may be exposed.

Figure 9A:
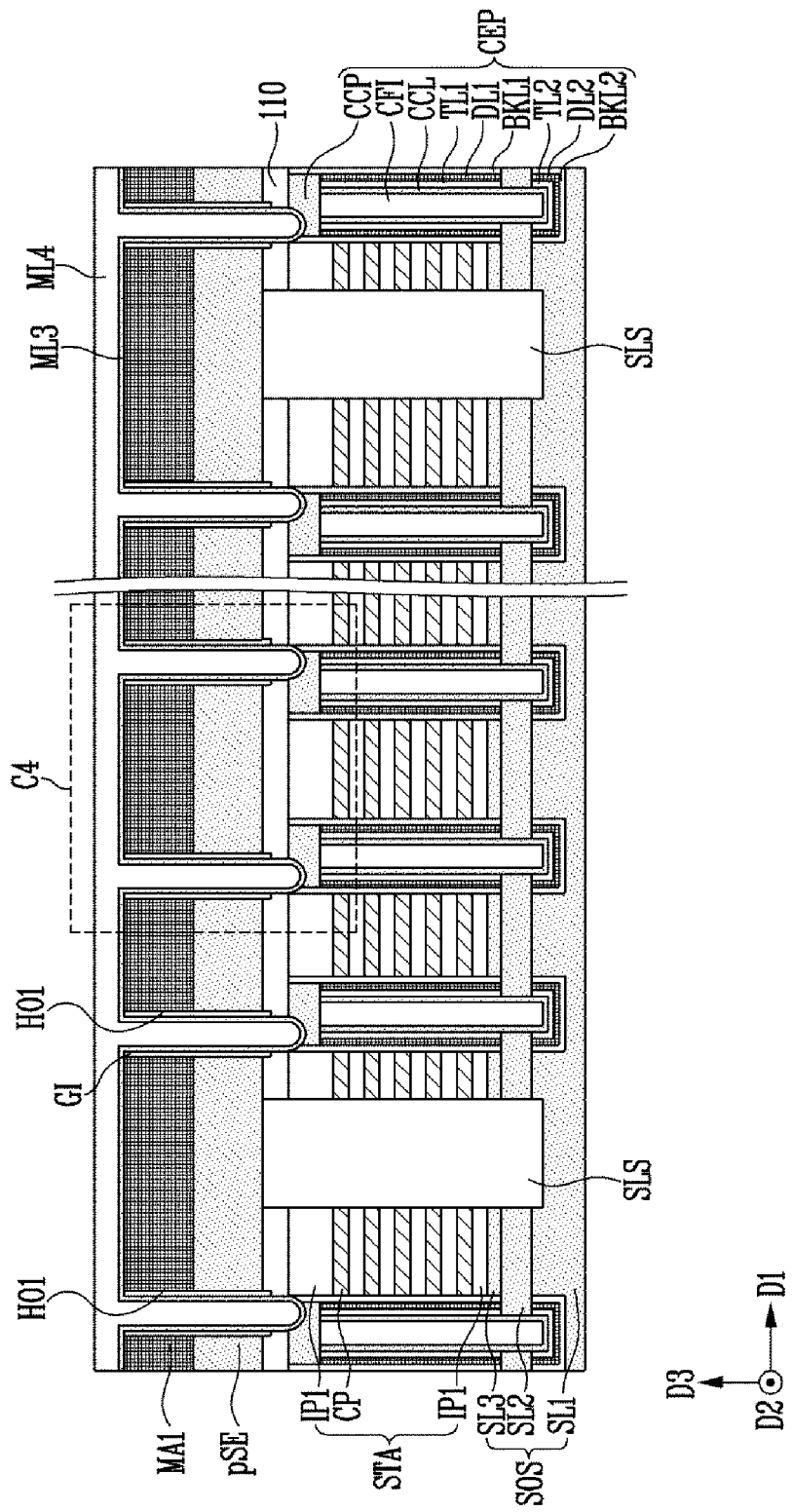

FIG. 9B is an enlarged view of region C4 of FIG. 9A.

Referring to FIGS. 9A and 9B, a third material layer ML3 may be formed to cover the first mask layer MA1, the gate insulating layer GI, the first insulating layer 110, the first blocking layer BKL1, and the cell capping pattern CCP. The third material layer ML3 may be conformally formed over the first mask layer MA1, the gate insulating layer GI, the first insulating layer 110, the first blocking layer BKL1, and the cell capping pattern CCP. The third material layer ML3 may include a conductive material such as polysilicon.

A fourth material layer ML4 covering the third material layer ML3 may be formed. The fourth material layer ML4 may completely fill the first holes HO1. The fourth material layer ML4 may include an insulating material. For example, the fourth material layer ML4 may include an oxide.

Figure 10:
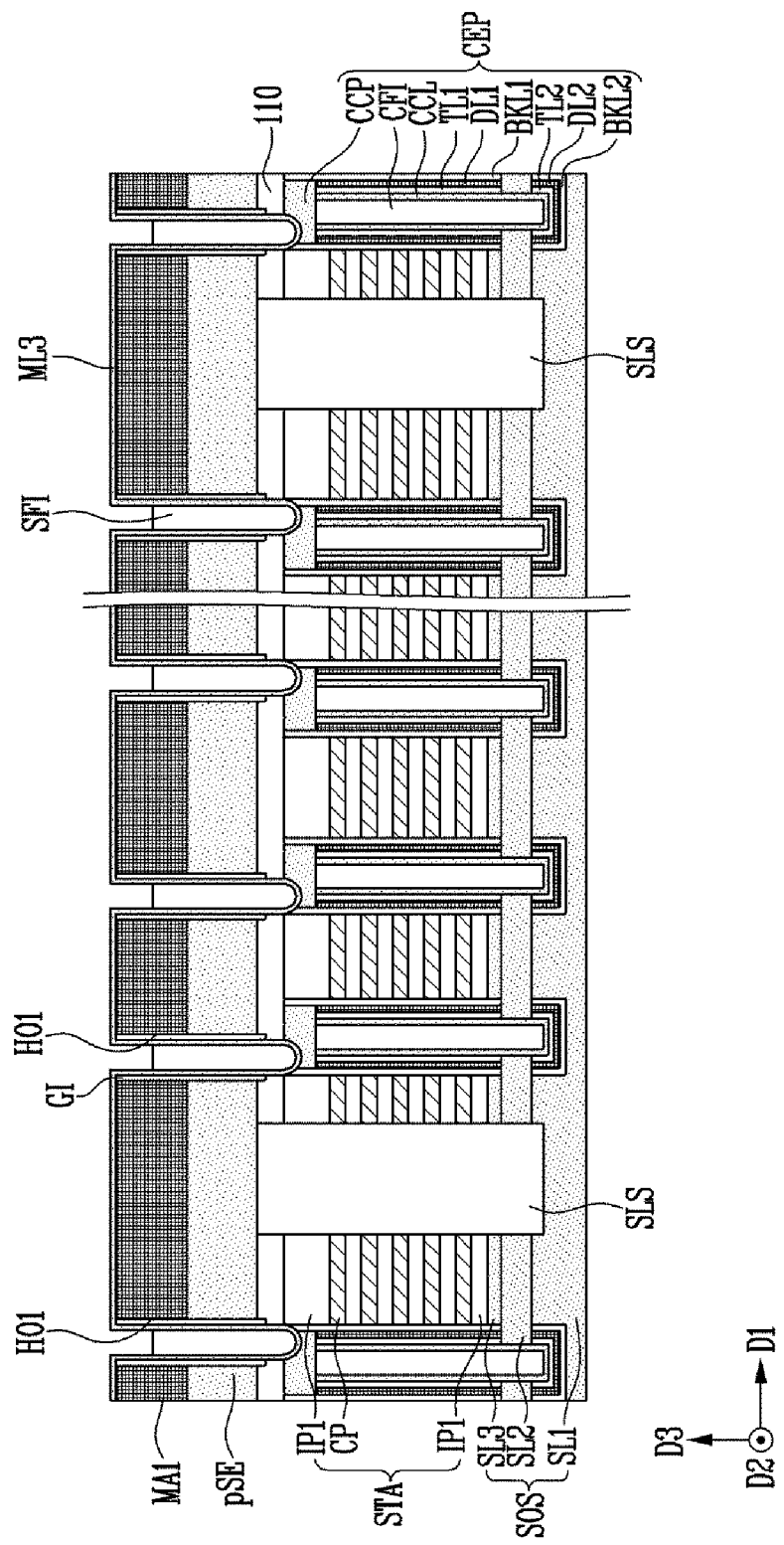

Referring to FIG. 10, the fourth material layer ML4 may be etched. The fourth material layer ML4 may be etched, such that an upper portion of the fourth material layer ML4 is removed and parts of the fourth material layer ML4 which are disposed in the first holes HO1 remain. The parts of the fourth material layer ML4 that remain in the first holes HO1 may be defined as the select filing layers SFI.

Figure 11:
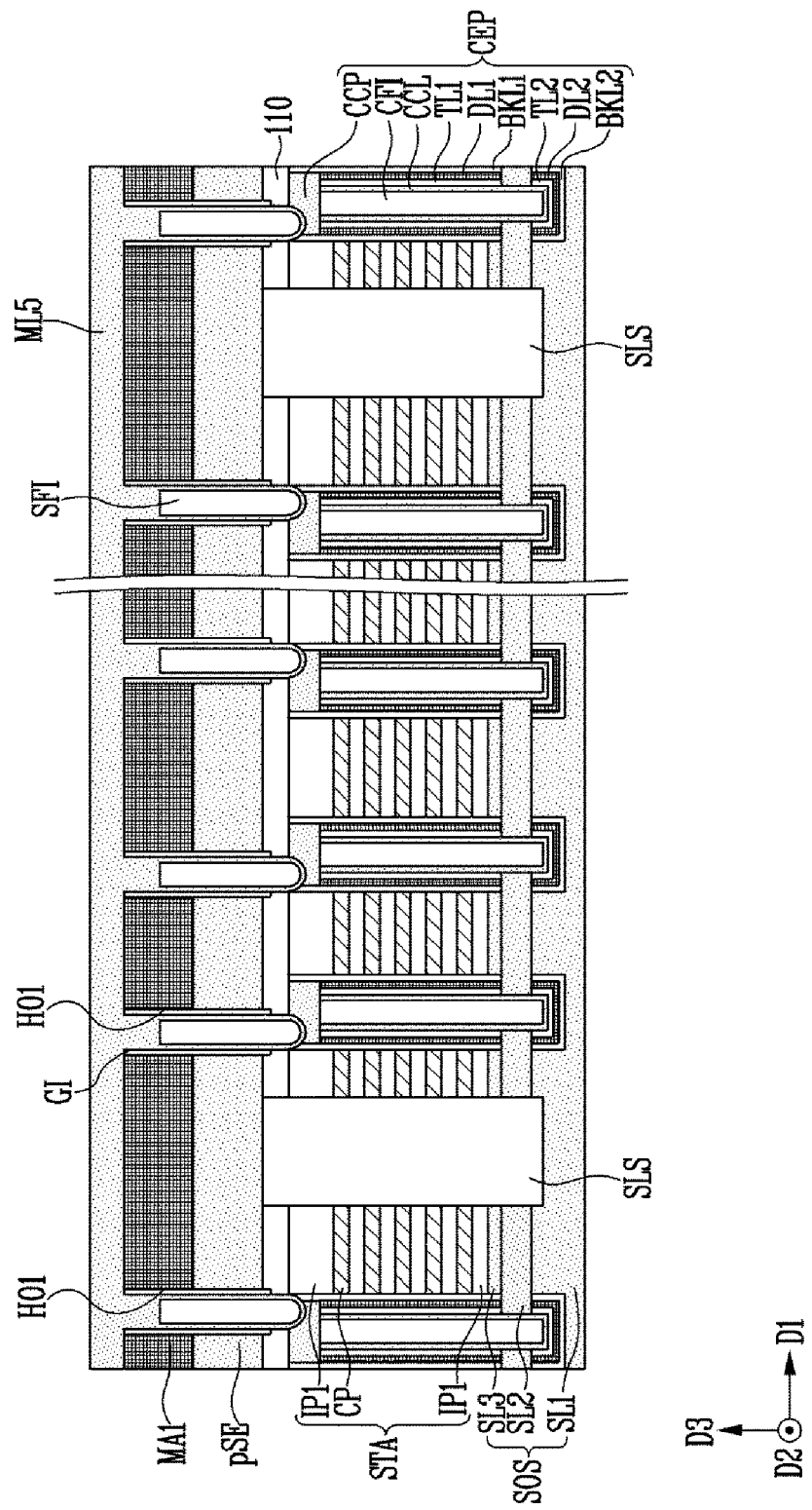

Referring to FIG. 11, a cover material layer covering the third material layer ML3 and the select filling layers SFI may be formed. The cover material layer may include the same material as the third material layer ML3, for example, polysilicon. Because the cover material layer includes the same material as the third material layer ML3, the cover material layer may be formed to be integrally coupled to the third material layer ML3. The cover material layer and the third material layer ML3 that are integrally coupled may be defined as a fifth material layer ML5. The fifth material layer ML5 may include a conductive material such as polysilicon.

Figure 12:
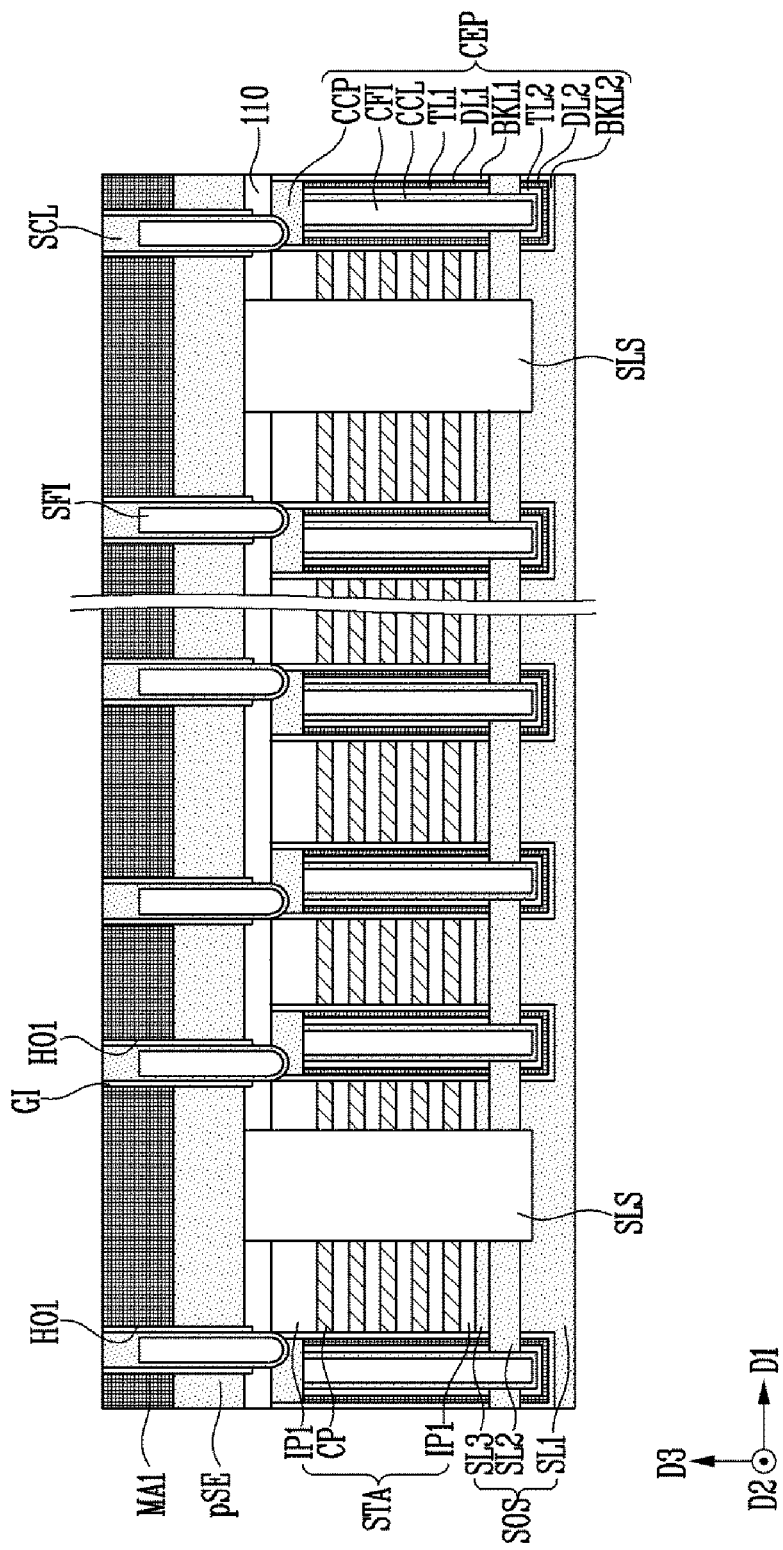

Referring to FIG. 12, an upper portion of the fifth material layer ML5 may be removed. For example, the upper portion of the fifth material layer ML5 may be removed by a chemical mechanical polishing (CMP) process. Parts of the fifth material layer ML5 that remain may be defined as the select channel layers SCL. The select channel layers SCL may remain in the first holes HO1. The upper portion of the fifth material layer ML5 may be removed to expose a top surface of the first mask layer MA1.

Figure 13:
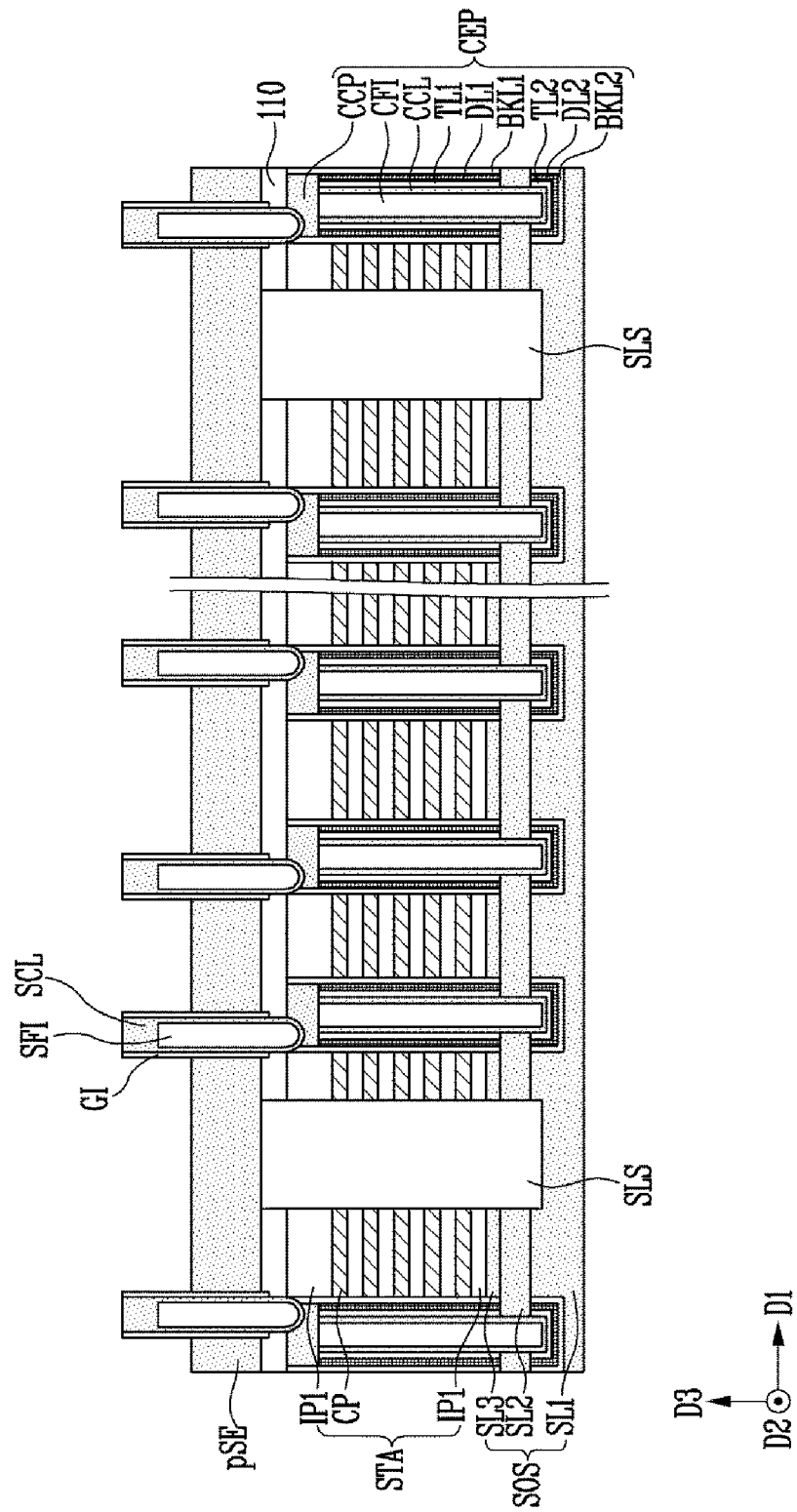

Referring to FIG. 13, the first mask layer MA1 may be removed. The first mask layer MA1 may be removed to expose a top surface of the preliminary select layer pSE. The first mask layer MA1 may be removed to expose outer sidewalls of the gate insulating layers GI.

Figure 14:
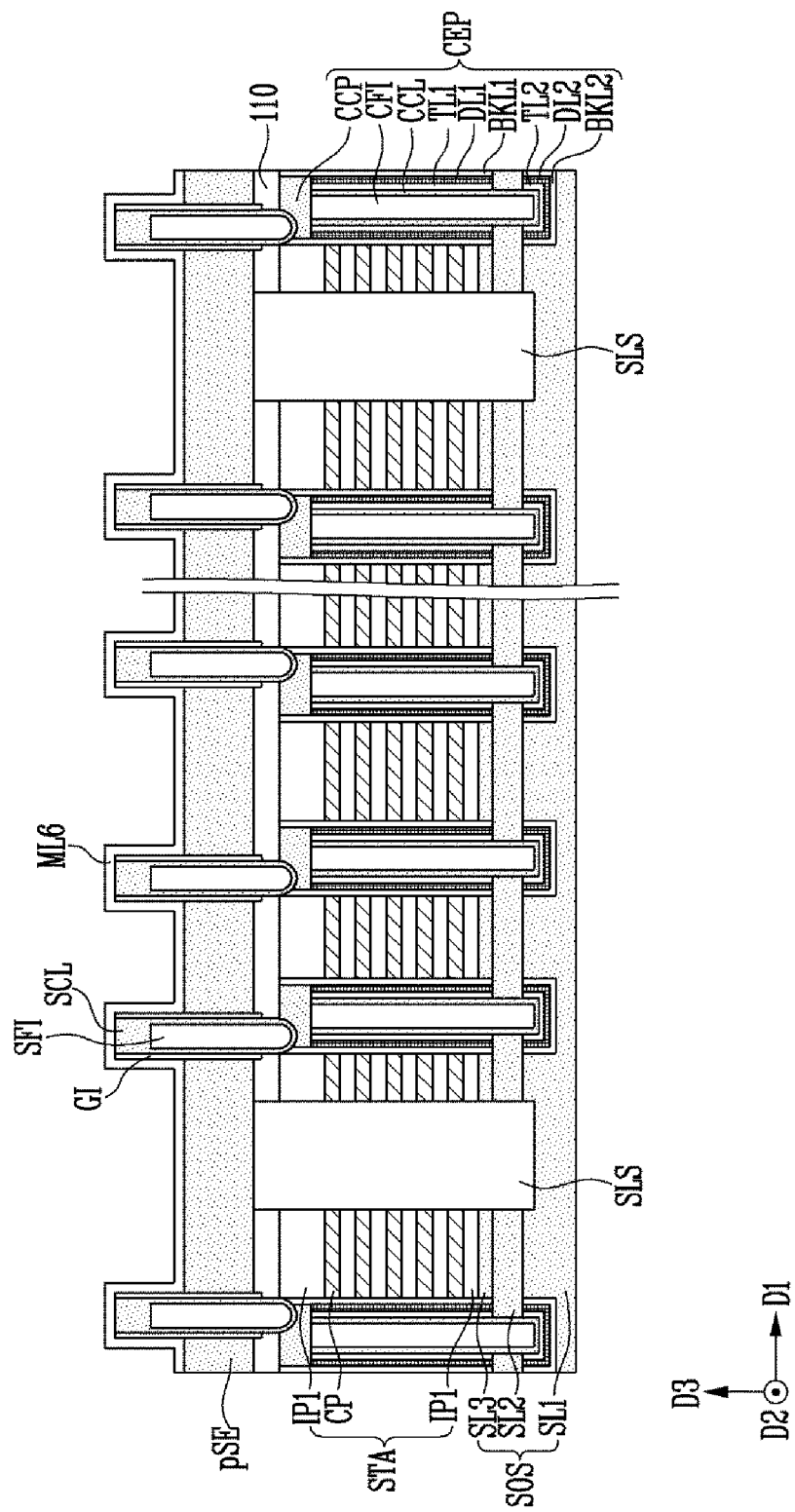

Referring to FIG. 14, a sixth material layer ML6 covering the top surface of the preliminary select layer pSE, the outer sidewalls of the gate insulating layers GI, and top surfaces of the select channel layers SCL may be formed. The sixth material layer ML6 may be conformally formed on the top surface of the preliminary select layer pSE, the outer sidewalls of the gate insulating layers GI, and the top surfaces of the select channel layers SCL. The sixth material layer ML6 may include an insulating material such as an oxide.

Figure 15:
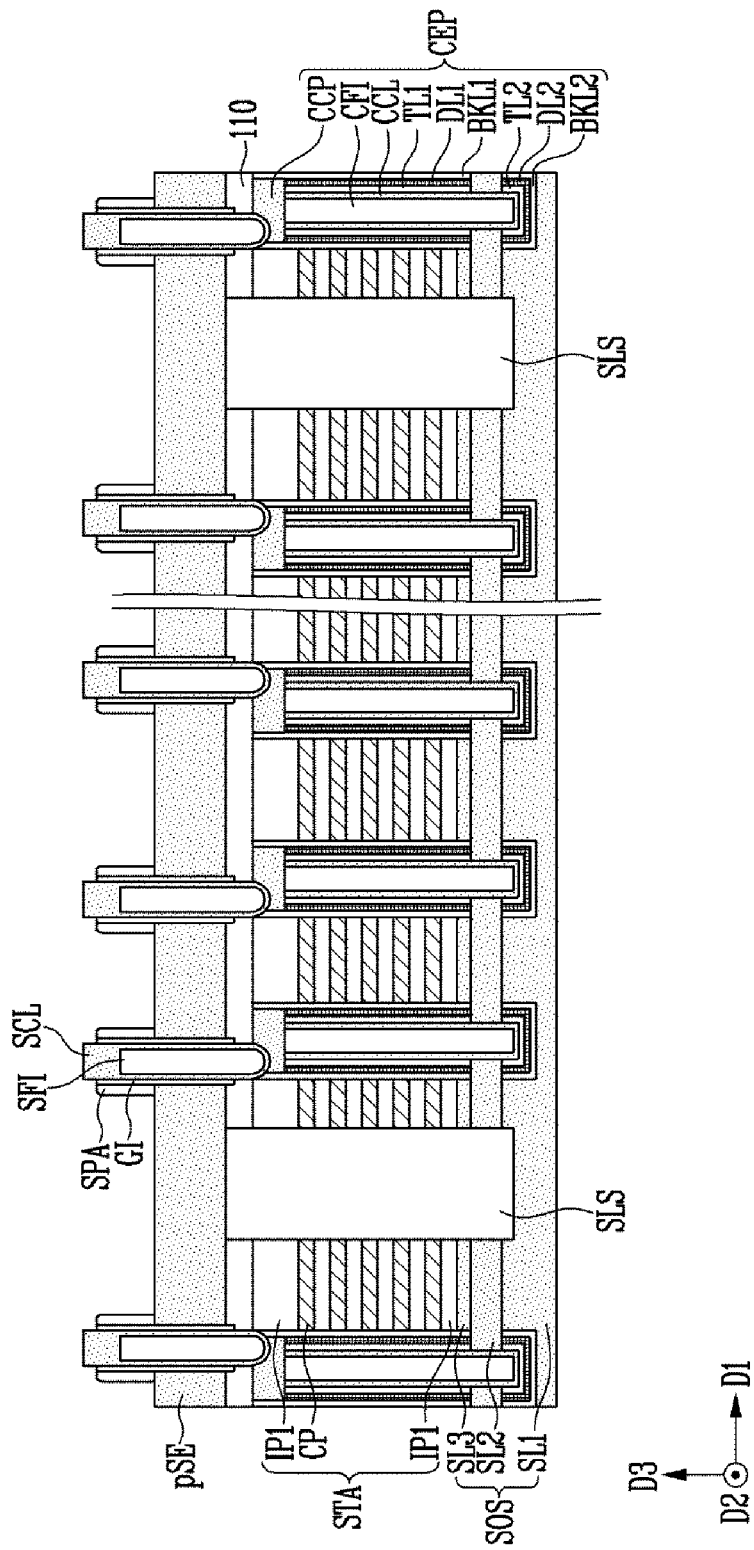

Referring to FIG. 15, the sixth material layer ML6 may be etched. The sixth material layer ML6 may be etched to form the spacers SPA. The sixth material layer ML6 may be etched to expose the top surface of the preliminary select layer pSE again. The sixth material layer ML6 may be etched to expose the top surface of the select channel layer SCL again. The gate insulating layer GI may be etched concurrently with etching the sixth material layer ML6. The gate insulating layer GI may be etched to expose a sidewall of the select channel layer SCL.

Figure 16:
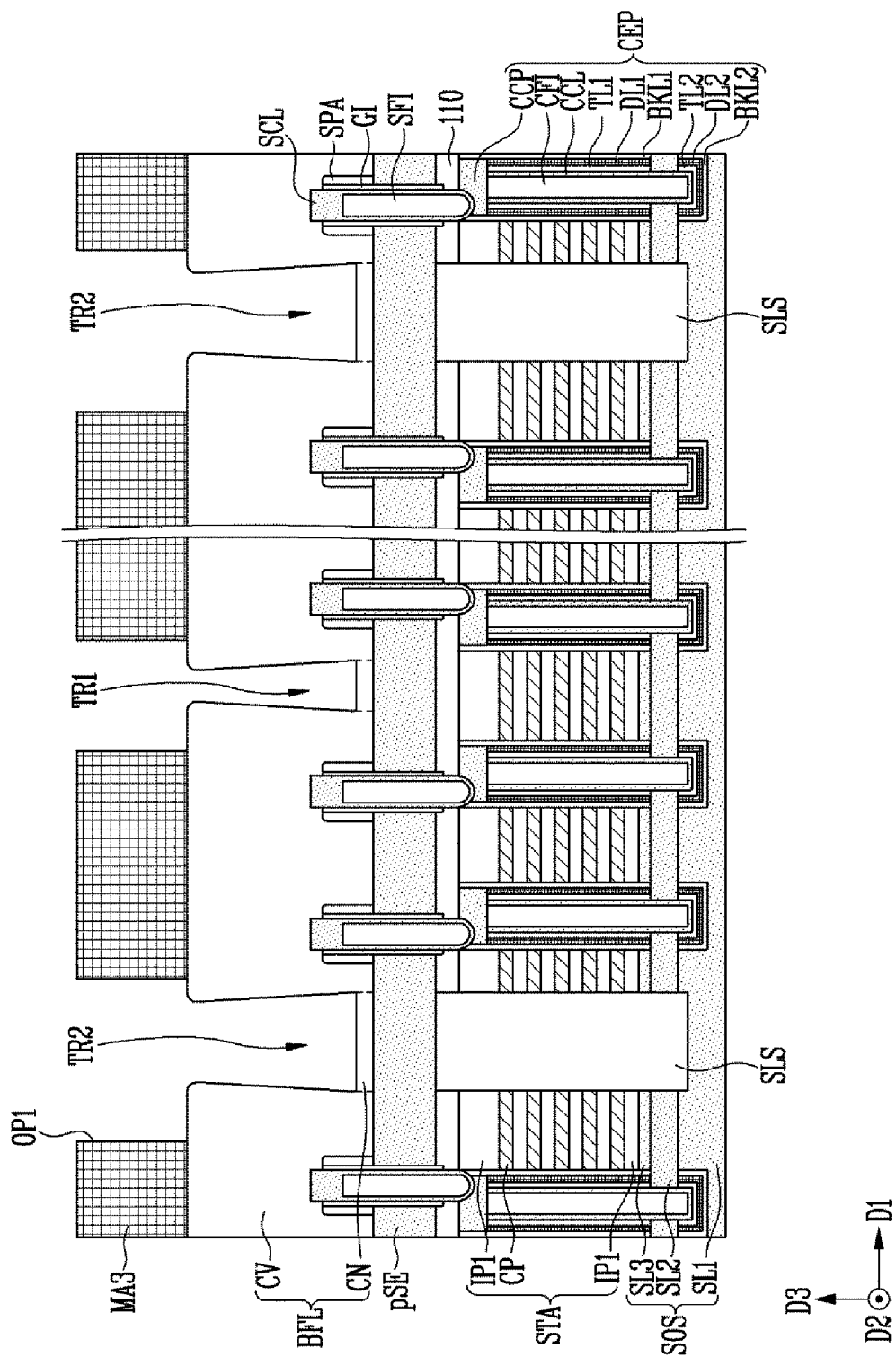

Referring to FIG. 16, a buffer sacrificial layer BFL covering the top surface of the preliminary select layer pSE, a top surface and a sidewall of each of the spacers SPA, a top surface of each of the gate insulating layers GI, and a top surface and a sidewall of each of the select channel layers SCL may be formed. The buffer sacrificial layer BFL may include cover portions CV and coupling portions CN. The cover portion CV may cover the top surface and the sidewall of each of the spacers SPA, the top surface of each of the gate insulating layers GI, and the top surface and the sidewall of each of the select channel layers SCL. The coupling portion CN may couple the cover portions CV. The coupling portion CN may be formed on the top surface of the preliminary select layer pSE. The cover portion CV may have a width which decreases towards a portion adjacent to the preliminary select layer pSE and the stacked structure STA. For example, the cover portion CV may have a width in the first direction D1 which decreases towards a portion adjacent to the preliminary select layer pSE and the stacked structure STA.

A first trench TR1 or a second trench TR2 may be defined between the cover portions CV. The first trench TR1 may be defined between the adjacent cover portions CV disposed between the adjacent slit structures SLS. The second trench TR2 may be defined between each pair of the cover portions CV disposed at both sides of the slit structure SLS. Each of the first and second trenches TR1 and TR2 may be defined by sidewalls of the adjacent cover portions CV and a top surface of the coupling portion CN. Due to a shape of the cover portions CV, each of the first and second trenches TR1 and TR2 may have a width which increases towards a portion adjacent to the coupling portion CN, the preliminary select layer pSE, and the stacked structure STA. For example, the first and second trenches TR1 and TR2 may have a width in the first direction D1 which increases towards the portion adjacent to the coupling portion CN, the preliminary select layer pSE, and the stacked structure STA.

The buffer sacrificial layer BFL may be formed by depositing a first deposition material having relatively poor step coverage. Because the first deposition material has relatively poor step coverage, each of the first and second trenches TR1 and TR2 and the cover portion CV may be formed to have a width which varies depending on a portion. The buffer sacrificial layer BFL may have etch selectivity with respect to the preliminary select layer pSE. For example, the buffer sacrificial layer BFL may include an amorphous carbon layer.

A third mask layer MA3 may be formed over the buffer sacrificial layer BFL. The third mask layer MA3 may include first openings OP1 exposing the first and second trenches TR1 and TR2. Forming the third mask layer MA3 may include forming a photoresist layer covering the buffer sacrificial layer BFL and forming the first openings OP1 in the photoresist layer. The first openings OP1 may expose the top surface of the coupling portion CN, a sidewall of the cover portion CV, and a part of a top surface of the cover portion CV. A part of the cover portion CV may overlap the first opening OP1.

Figure 17A:
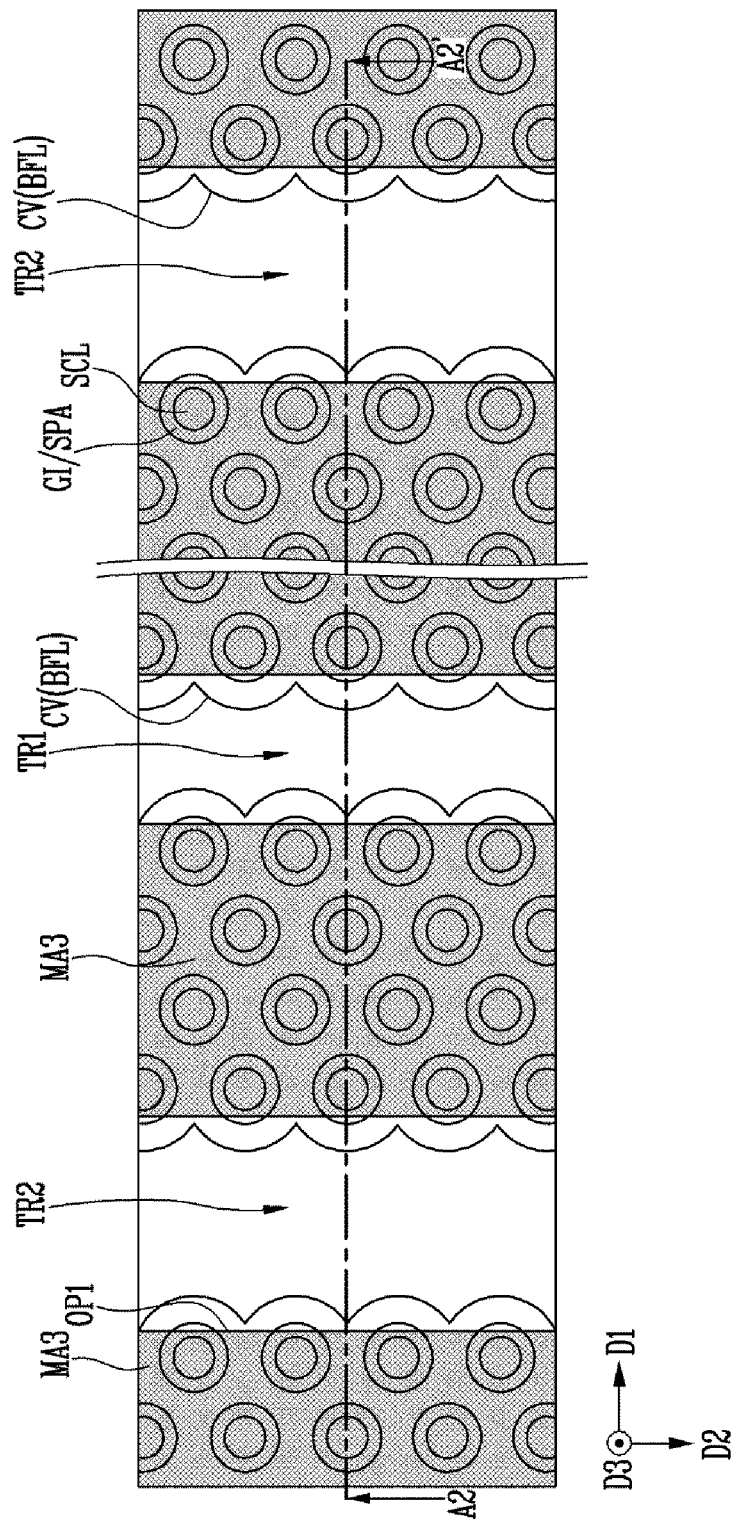
Figure 17B:
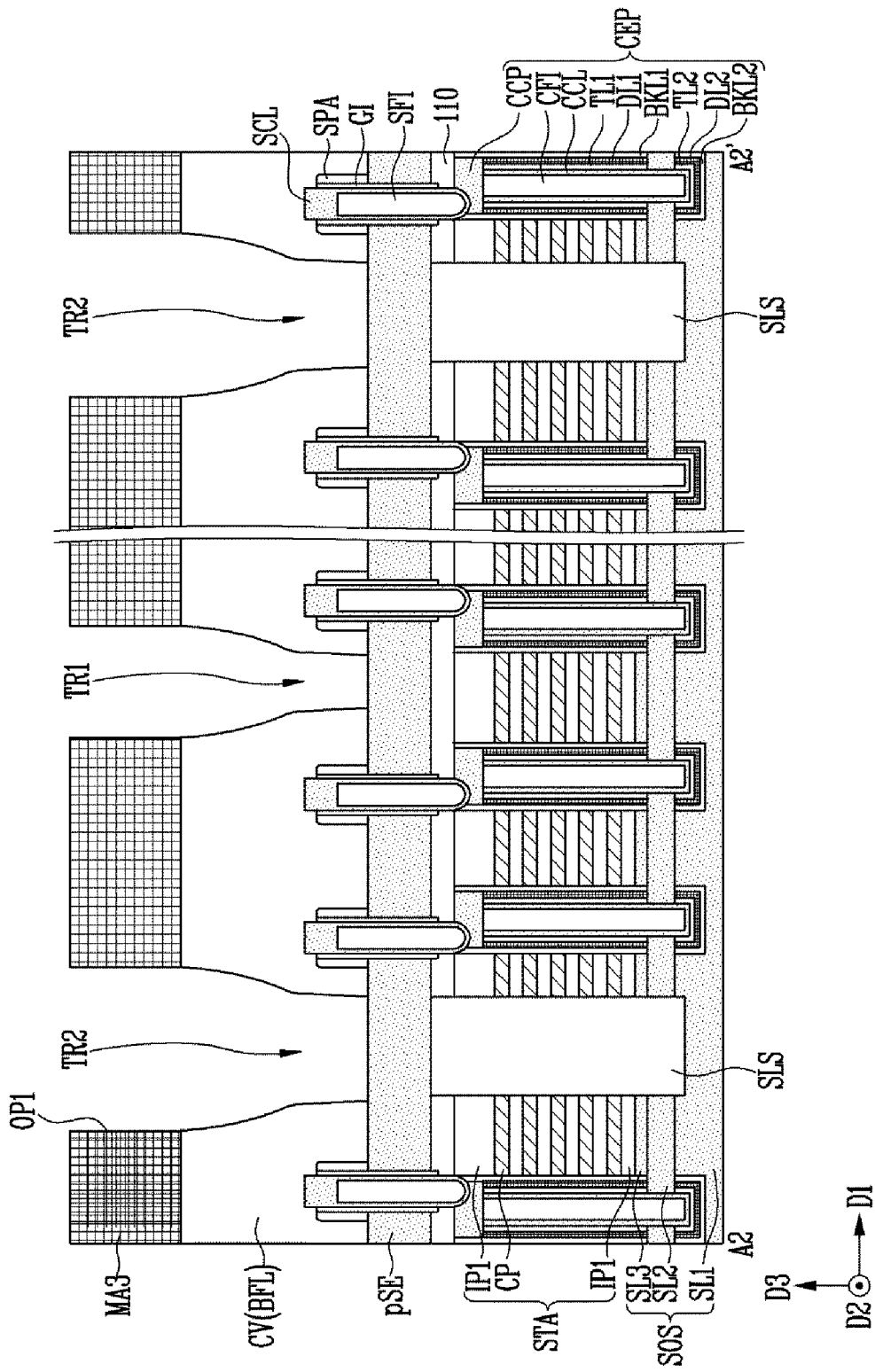

FIG. 17B is a cross-sectional diagram taken along line A2-A2' of FIG. 17A.

Referring to FIGS. 17A and 17B, the buffer sacrificial layer BFL may be etched using the third mask layer MA3 as an etching mask. The buffer sacrificial layer BFL may be etched to remove the parts of the cover portions CV which overlap the first openings OP1. The buffer sacrificial layer BFL may be etched to remove the coupling portions CN.

The coupling portions CN and the part of each of the cover portions CV of the buffer sacrificial layer BFL may be removed to expand the first and second trenches TR1 and TR2. The top surface of the preliminary select layer pSE may be exposed through the expanded first and second trenches TR1 and TR2. The part of each of the cover portions CV of the buffer sacrificial layer BFL may be removed, and therefore the cover portions CV may be changed. The changed cover portion CV may have a width which increases towards a portion adjacent to the preliminary select layer pSE and the stacked structure STA.

During an etching process of the buffer sacrificial layer BFL, the parts of the cover portions CV which overlap the first openings OP1 may serve as etching barriers. Accordingly, even when the first opening OP1 in the third mask layer MA3 has a width relatively great in the first direction D1, each of the expanded first and second trenches TR1 and TR2 may be formed to have a relatively small width in the first direction D1. After the buffer sacrificial layer BFL is etched, the third mask layer MA3 may be removed.

Figure 18A:
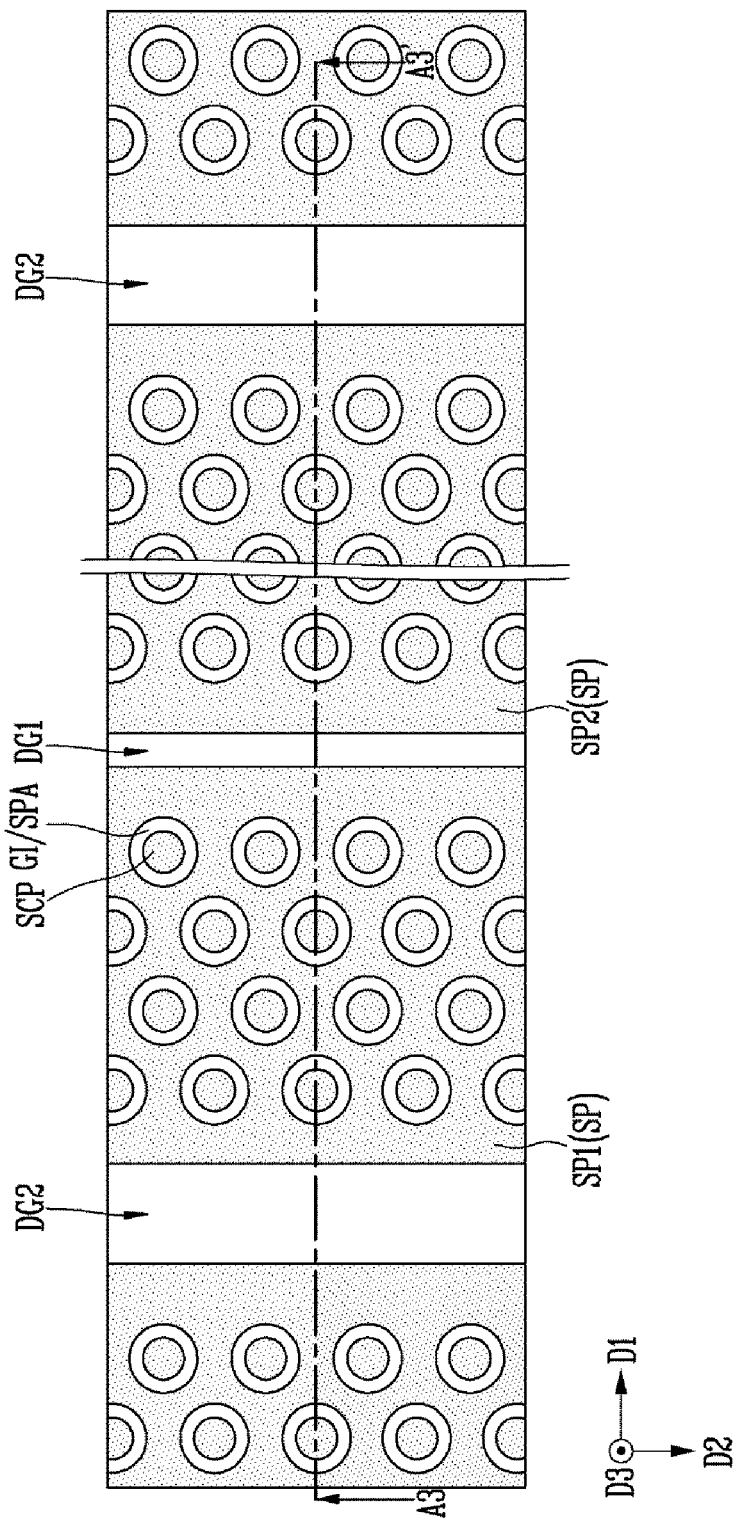

FIG. 18B is a cross-sectional diagram taken along line A3-A3' of FIG. 18A.

Referring to FIGS. 18A and 18B, the preliminary select layer pSE may be etched through the first and second trenches TR1 and TR2. The preliminary select layer pSE may be etched to be divided into preliminary select patterns pSP. The first isolation gap DG1 and the second isolation gap DG2 may be defined between the preliminary select patterns pSP. The preliminary select patterns pSP may be spaced apart from each other in the first direction D1 by the first and second isolation gaps DG1 and DG2. Each of the preliminary select patterns pSP may surround the plurality of select channel layers SCL.

After the preliminary select layer pSE is etched, the cover portions CV of the buffer sacrificial layer BFL may be removed. The cover portions CV of the buffer sacrificial layer BFL may be removed to expose top surfaces of the preliminary select patterns pSP, the top surfaces and the sidewalls of the spacers SPA, the top surfaces of the gate insulating layers GI, and the top surfaces and the sidewalls of the select channel layers SCL.

Figure 19:
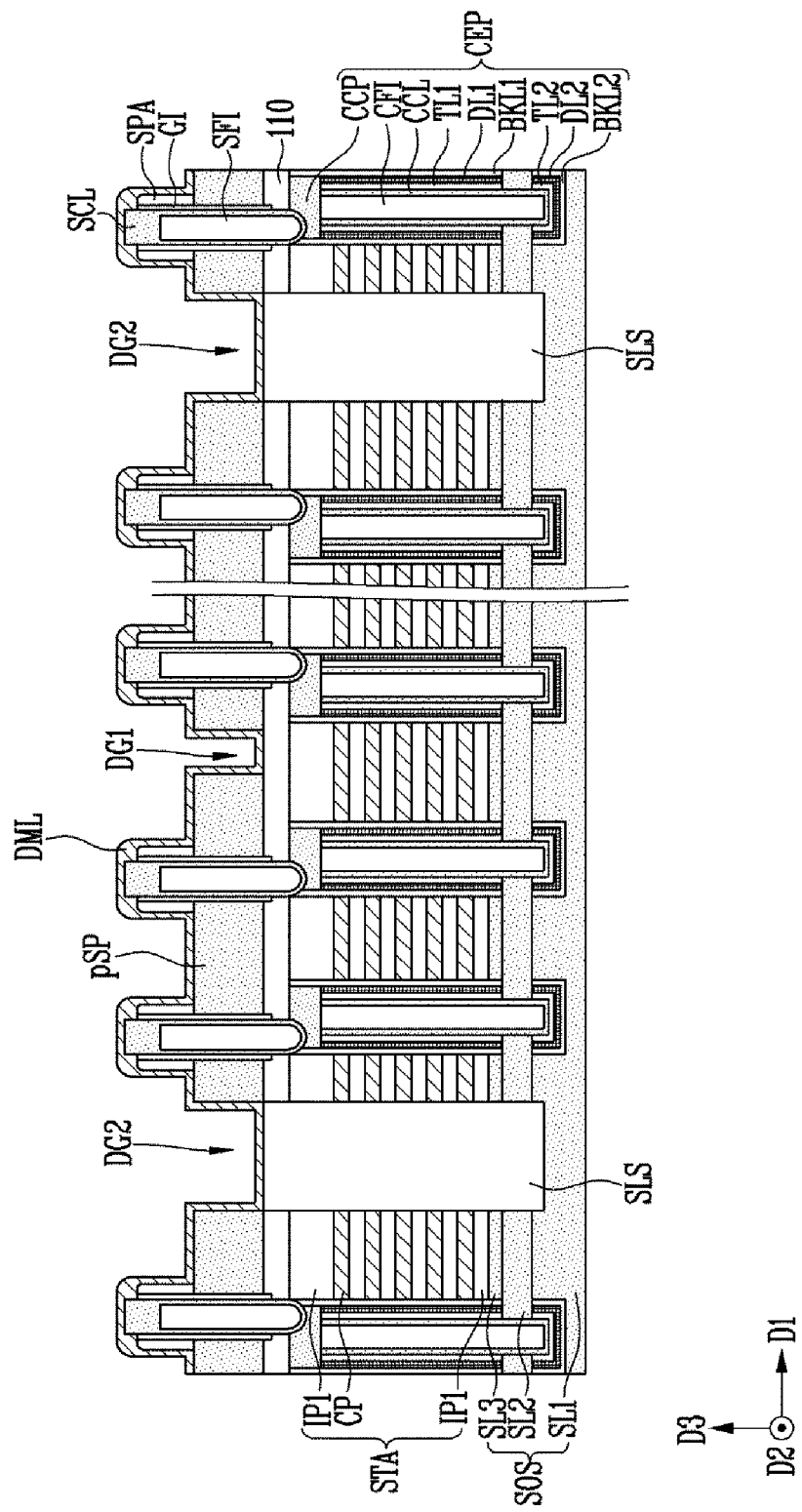

Referring to FIG. 19, a diffusion metal layer DML covering the top surfaces and sidewalls of the preliminary select patterns pSP, the top surfaces and the sidewalls of the spacers SPA, the top surfaces of the gate insulating layers GI, and the top surfaces and the sidewalls of the select channel layers SCL may be formed. The diffusion metal layer DML may be conformally formed on the top surfaces and the sidewalls of the preliminary select patterns pSP, the top surfaces and the sidewalls of the spacers SPA, the top surfaces of the gate insulating layers GI, and the top surfaces and the sidewalls of the select channel layers SCL.

The diffusion metal layer DML may include a metal material such as, for example, nickel platinum. For example, a composition of the nickel platinum included in the diffusion metal layer DML may be NiPt. The diffusion metal layer DML may include metal that may be diffused into the select channel layer SCL and the preliminary select pattern pSP at a temperature less than a temperature capable generating fumes in the conductive patterns CP. For example, the diffusion metal layer DML may include nickel that may be diffused into the select channel layer SCL and the preliminary select pattern pSP.

Figure 20A:
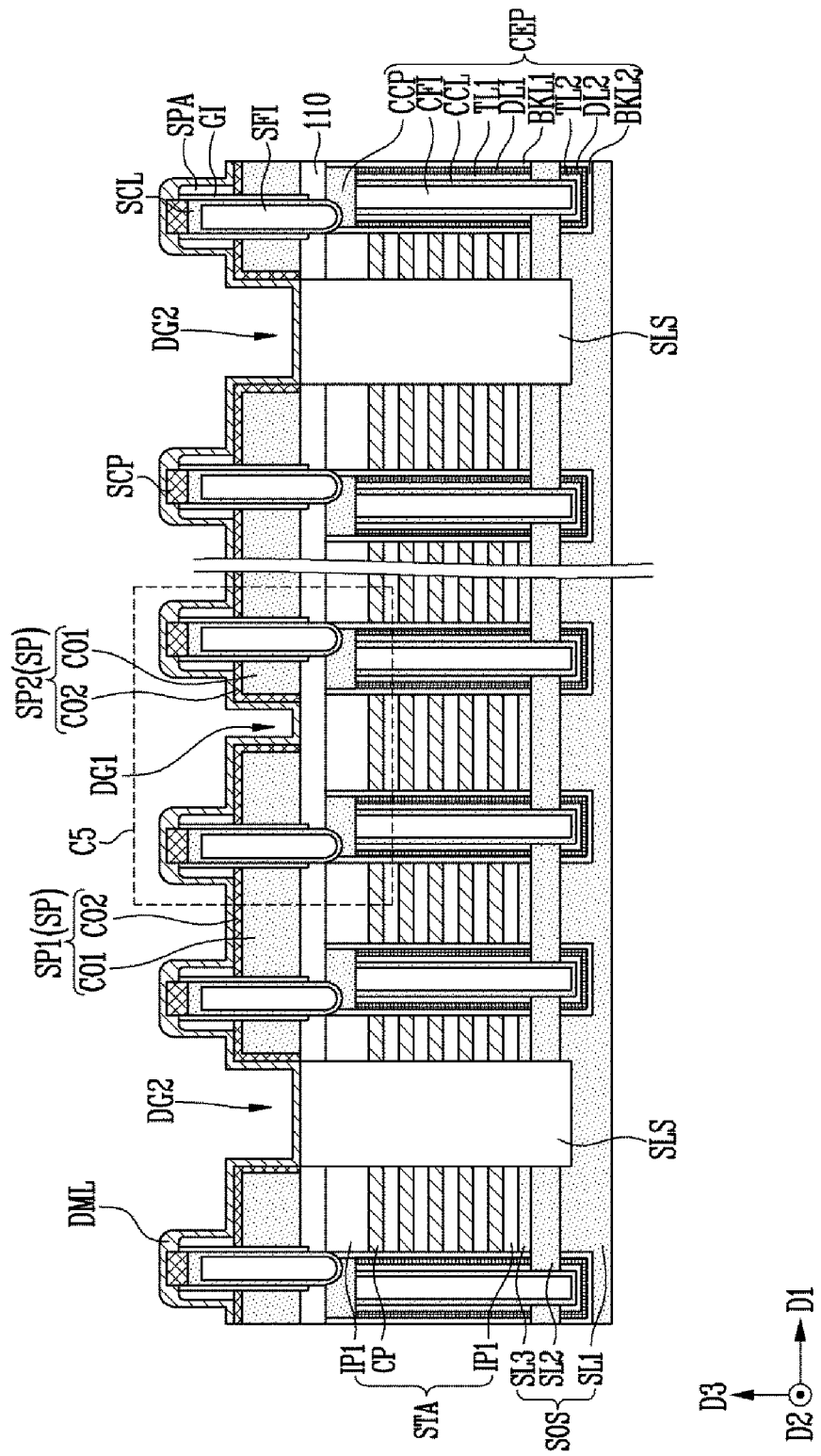
Figure 20B:
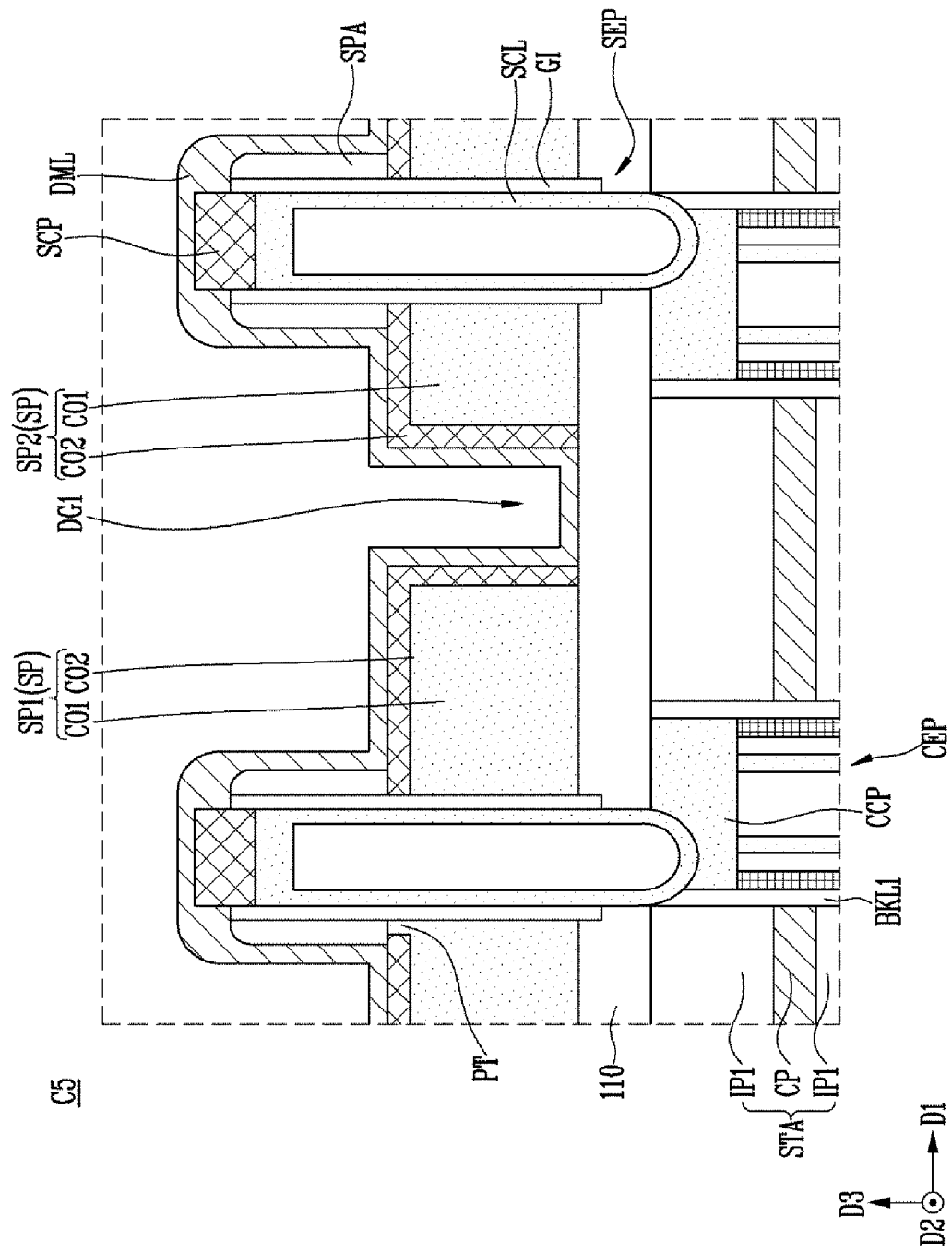

FIG. 20B is an enlarged view of region C5 of FIG. 20A.

Referring to FIGS. 20A and 20B, the select capping pattern SCP and the select pattern SP may be formed.

A composition of a part of the preliminary select pattern pSP may be changed to form the select pattern SP including the first conductive portion CO1 and the second conductive portion CO2. A composition of a part of the preliminary select pattern pSP which is adjacent to the diffusion metal layer DML may be changed to form the second conductive portion CO2 of the select pattern SP. The remaining part of the preliminary select pattern pSP of which composition is not changed may be defined as the first conductive portion CO1.

A composition of a part of the select channel layer SCL may be changed to form the select capping pattern SCP. A composition of a part of the select channel layer SCL which is adjacent to the diffusion metal layer DML may be changed to form the select capping pattern SCP.

The second conductive portion CO2 of the select pattern SP and the select capping pattern SCP may be formed by a heat process. The heat process may be performed at a temperature of less than or equal to 450° C. Metal included in the diffusion metal layer DML may be diffused into the select channel layer SCL and the preliminary select pattern pSP, and the select capping pattern SCP and the second conductive portion CO2 of the select pattern SP may be formed by the heat process. For example, nickel included in the diffusion metal layer DML may be diffused into the select channel layer SCL and the preliminary select pattern pSP by the heat process. For example, the nickel diffused into the select channel layer SCL and the preliminary select pattern pSP may be combined with silicon in the select channel layer SCL and the preliminary select pattern pSP.

The select capping pattern SCP and the second conductive portion CO2 of the select pattern SP may include nickel silicide. For example, a composition of the nickel silicide included in the select capping pattern SCP and the second conductive portion CO2 of the select pattern SP may be NiSi. The select capping pattern SCP may form an ohmic contact with the select channel layer SCL. The second conductive portion CO2 of the select pattern SP may form an ohmic contact with the first conductive portion CO1.

A composition of a part of the preliminary select pattern pSP which contacts the bottom surface of the spacer SPA and the sidewall of the gate insulating layer GI might not be changed, and this part of the preliminary select pattern pSP may be defined as the protrusion PT of the first conductive portion CO1.

The select patterns SP may be classified into the first and second select patterns SP1 and SP2.

Figure 21:
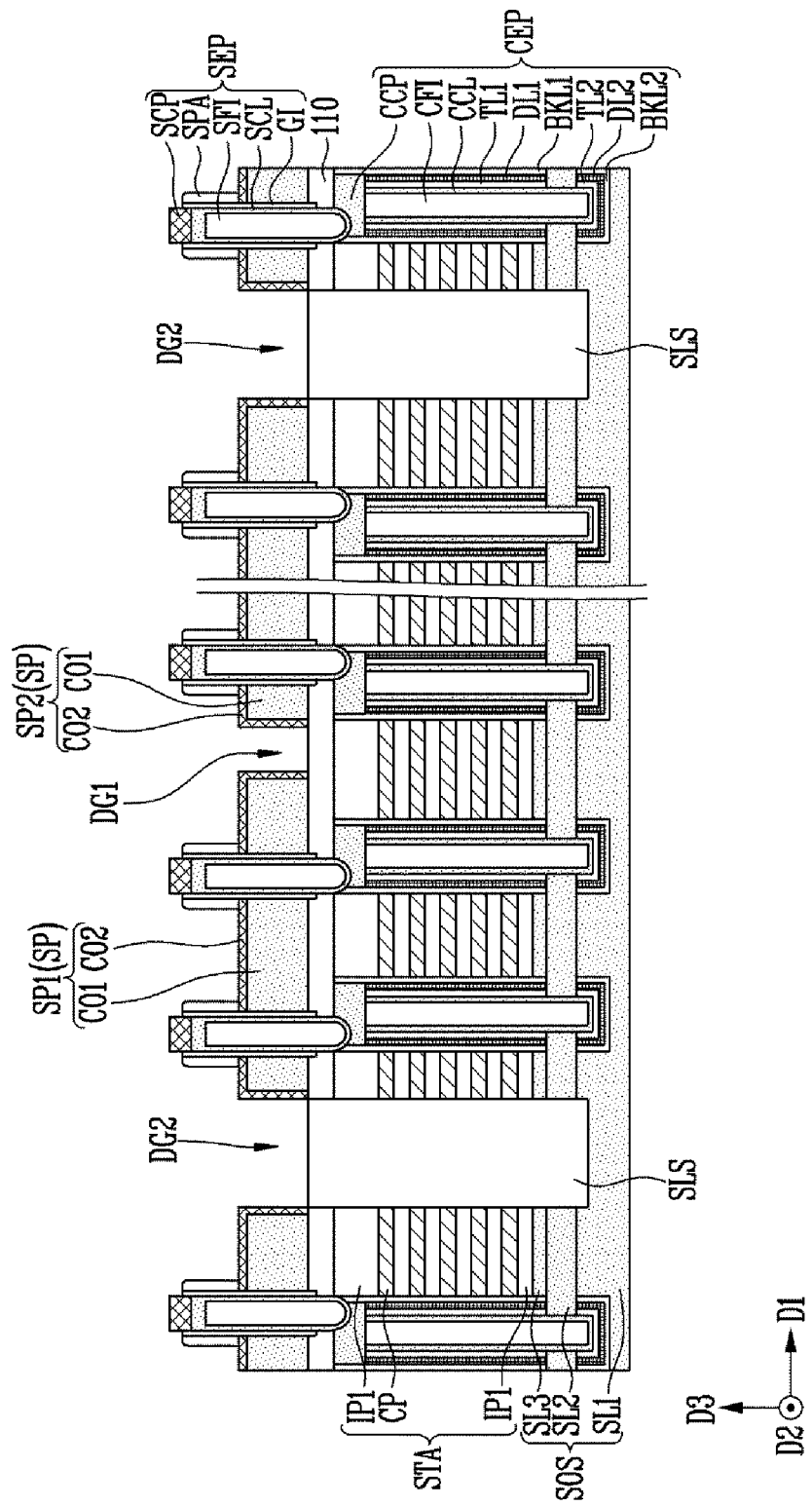

Referring to FIG. 21, the diffusion metal layer DML may be removed. The diffusion metal layer DML may be removed to expose the top surfaces and the sidewalls of the select patterns SP, the top surfaces and the sidewalls of the spacers SPA, the top surfaces of the gate insulating layers GI, and the top surfaces and the sidewalls of the select capping patterns SCP.

Figure 22:
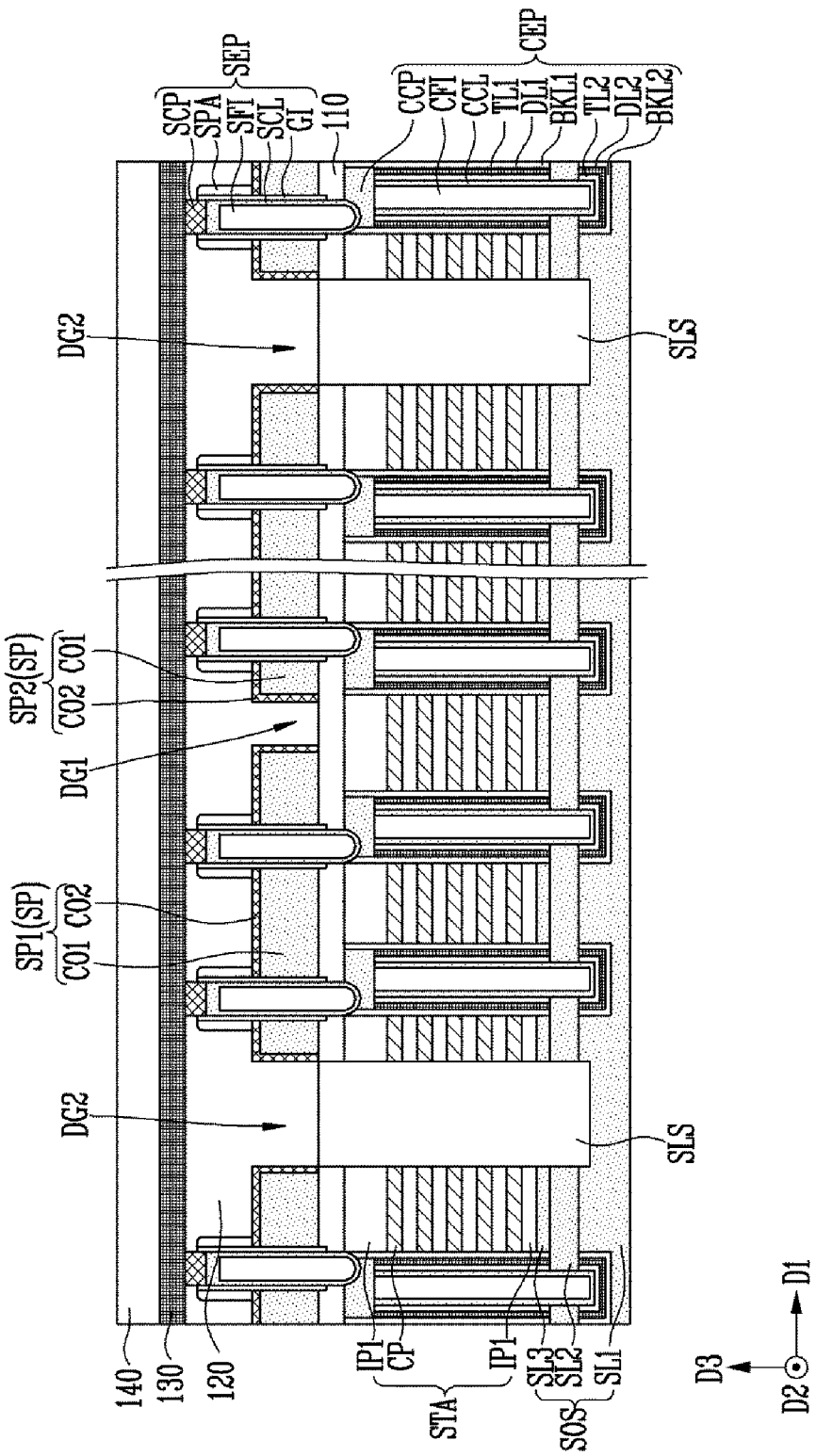

Referring to FIG. 22, the second insulating layer 120 covering the top surfaces and the sidewalls of the select patterns SP, the top surfaces and the sidewalls of the spacers SPA, the top surfaces of the gate insulating layers GI, and the sidewalls of the select capping patterns SCP may be formed. The second insulating layer 120 may cover the slit structures SLS. The second insulating layer 120 may fill the first and second isolation gaps DG1 and DG2 and may include an insulating material. For example, the second insulating layer 120 may include an oxide.

The third insulating layer 130 may be formed over the second insulating layer 120. The third insulating layer 130 may cover the select capping patterns SCP. The third insulating layer 130 may include an insulating material. For example, the third insulating layer 130 may include a nitride.

The fourth insulating layer 140 may be formed over the third insulating layer 130. The fourth insulating layer 140 may include an insulating material. For example, the fourth insulating layer 140 may include an oxide.

Subsequently, the bit line contacts BCT, referring to FIGS. 1B and 1C, may be formed in the third insulating layer 130 and the bit lines BL, referring to FIGS. 1B and 1C, may be formed in the fourth insulating layer 140.

According to an embodiment of a method of manufacturing a semiconductor device according to the present disclosure, the second conductive portion CO2 of the select pattern SP and the select capping pattern SCP may be formed by a heat process at a relatively low temperature. Accordingly, variation in characteristics of a memory cell and a select transistor by a heat process at a high temperature may be mitigated.

Figure 23:
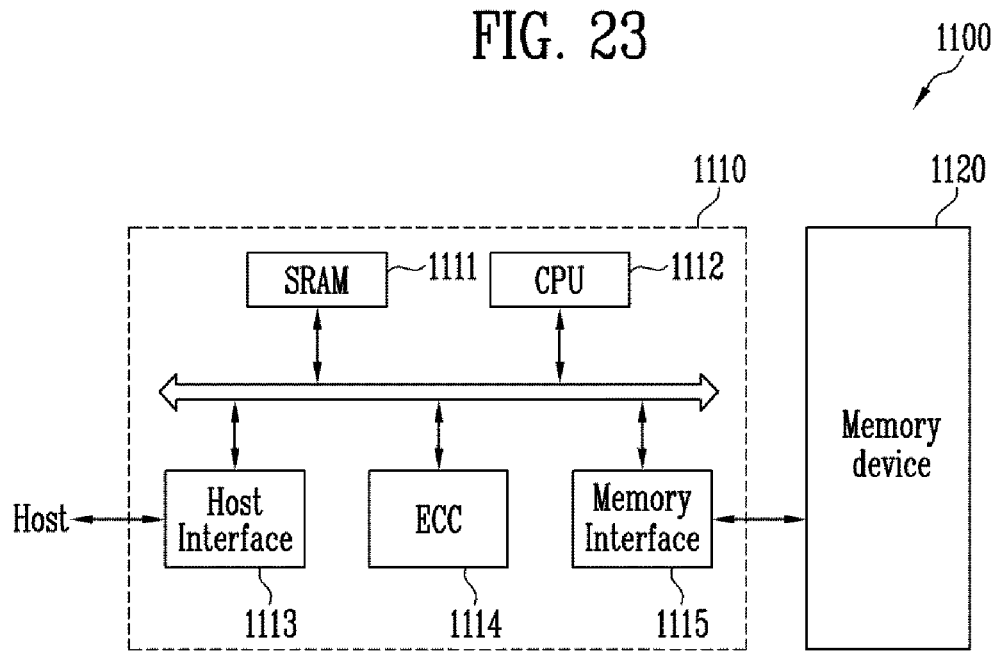
FIG. 23 is a block diagram illustrating the configuration of a memory system according to an embodiment.

FIG. 23 is a block diagram illustrating the configuration of a memory system 1100 according to an embodiment.

Referring to FIG. 23, the memory system 1100 according to an embodiment may include a memory device 1120 and a memory controller 1110.

The memory device 1120 may include a semiconductor device according to an embodiment. The memory device 1120 may be a multi-chip package including a plurality of flash memory chips.

The memory controller 1110 may be configured to control the memory device 1120 and may include Static Random Access Memory (SRAM) 1111, a Central Processing Unit (CPU) 1112, a host interface 1113, an Error Correction Code (ECC) circuit 1114, and a memory interface 1115. The SRAM 1111 may serve as operational memory of the CPU 1112, the CPU 1112 may perform general control operations for data exchange of the memory controller 1110, and the host interface 1113 may include a data exchange protocol of a host accessing the memory system 1100. In addition, the ECC circuit 1114 may detect and correct errors included in data read from the memory device 1120, and the memory interface 1115 may perform interfacing with the memory device 1120. In addition, the memory controller 1110 may further include Read Only Memory (ROM) for storing code data for interfacing with the host.

The memory system 1100 having the above-described configuration may be a Solid State Drive (SSD) or a memory card in which the memory device 1120 and the memory controller 1110 are combined. For example, when the memory system 1100 is an SSD, the memory controller 1110 may communicate with an external device (e.g., a host) through one of various interface protocols such as a Universal Serial Bus (USB), a MultiMedia Card (MMC), Peripheral Component Interconnection-Express (PCI-E), Serial Advanced Technology Attachment (SATA), Parallel Advanced Technology Attachment (PATA), a Small Computer System Interface (SCSI), an Enhanced Small Disk Interface (ESDI), and Integrated Drive Electronics (IDE).

Figure 24:
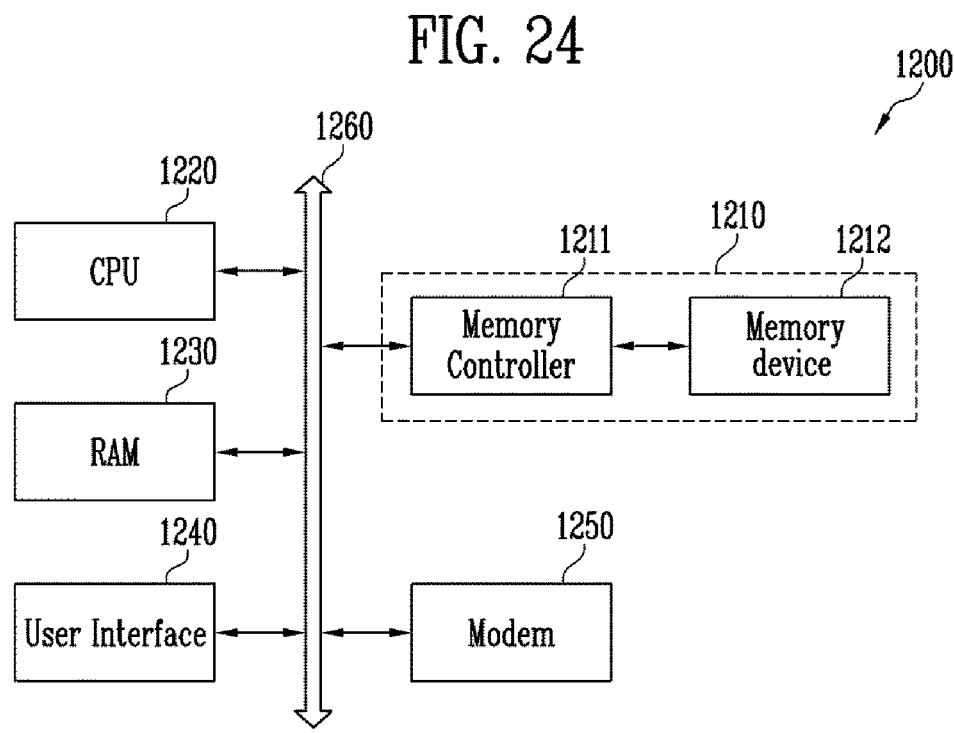
FIG. 24 is a block diagram illustrating the configuration of a computing system according to an embodiment.

FIG. 24 is a block diagram illustrating the configuration of a computing system 1200 according to an embodiment.

Referring to FIG. 24, the computing system 1200 according to the embodiment may include a CPU 1220, Random Access Memory (RAM) 1230, a user interface 1240, a modem 1250, and a memory system 1210 that are electrically coupled to a system bus 1260. In addition, when the computing system 1200 is a mobile device, a battery for supplying an operating voltage to the computing system 1200 may be further included, an application chipset, a camera image processor, mobile DRAM, and the like may also be included.

The memory system 1210 may include a memory device 1212 and a memory controller 1211 similar to those described above with reference to FIG. 23.

According to embodiments of the present disclosure, because a semiconductor device is configured such that a select pattern includes nickel silicide, an RC delay may be minimized.

What is claimed is:

1. A semiconductor device, comprising:
   a stacked structure including a plurality of conductive patterns and a plurality of insulating patterns alternately stacked on each other;
   a cell plug passing through the stacked structure;
   a select plug coupled to the cell plug; and
   a select pattern surrounding the select plug,
   wherein the select pattern includes a first conductive portion and a second conductive portion covering a sidewall and a top surface of the first conductive portion,
   wherein the plurality of conductive patterns, the first conductive portion, and the second conductive portion include different materials, and
   wherein the select plug protrudes farther than the select pattern in an opposite direction toward the cell plug.

2. The semiconductor device of claim 1,
   wherein the select plug includes a select channel layer and a select capping pattern over the select channel layer, and
   wherein the select capping pattern includes a same material as the second conductive portion.

3. The semiconductor device of claim 2,
   wherein the select plug further includes a gate insulating layer surrounding the select channel layer and the select capping pattern, and
   wherein the gate insulating layer passes through the select pattern.

4. The semiconductor device of claim 1, further comprising a spacer surrounding an upper portion of the select plug, the upper portion of the select plug being located higher than the select pattern,
   wherein a bottom surface of the spacer contacts a top surface of the select pattern.

5. The semiconductor device of claim 1,
   wherein the second conductive portion includes metal silicide.

6. The semiconductor device of claim 5,
   wherein the first conductive portion includes polysilicon.

7. The semiconductor device of claim 1,
   wherein the first conductive portion includes a protrusion passing through the second conductive portion.

8. A semiconductor device, comprising:
   a stacked structure including a plurality of conductive patterns and a plurality of insulating patterns alternately stacked on each other;
   a cell plug passing through the stacked structure;
   a select plug coupled to the cell plug; and
   a select pattern surrounding the select plug,
   wherein the select pattern includes a first conductive portion and a second conductive portion covering a sidewall and a top surface of the first conductive portion,
   wherein the second conductive portion includes metal silicide, and
   wherein the select plug protrudes farther than the select pattern in an opposite direction toward the cell plug.

9. The semiconductor device of claim 8, further comprising a first insulating layer covering the select pattern,
   wherein the first conductive portion is spaced apart from the first insulating layer by the second conductive portion.

10. The semiconductor device of claim 8, further comprising a first insulating layer covering the cell plug,
    wherein the select plug includes a select channel layer passing through the first insulating layer and a gate insulating layer surrounding the select channel layer, and
    wherein a bottom surface of the gate insulating layer is disposed in the first insulating layer.

11. The semiconductor device of claim 8,
    wherein the select plug includes a select channel layer, a select capping pattern over the select channel layer, and a gate insulating layer surrounding the select channel layer.

12. The semiconductor device of claim 11,
    wherein a level of a bottom surface of the select capping pattern is lower than a level of a top surface of the gate insulating layer.

13. The semiconductor device of claim 12,
    wherein the level of the top surface of the gate insulating layer is higher than a level of a top surface of the select channel layer.

14. The semiconductor device of claim 8, further comprising a bit line contact connecting the select plug,
    wherein the select plug includes a select channel layer and a select capping pattern over the select channel layer, and
    wherein the select capping pattern connects the bit line contact to the select channel layer.

15. The semiconductor device of claim 8, comprising a spacer being in direct contact with a portion of a side surface of the select plug.

16. The semiconductor device of claim 8, further comprising a spacer surrounding a portion of the select plug, wherein the spacer and the select pattern do not disposed at the same level.

* * * * *